(12) United States Patent
Kim et al.

(10) Patent No.: US 10,804,855 B2
(45) Date of Patent: Oct. 13, 2020

(54) METHOD AND DEVICE FOR SELECTIVELY SUPPLYING VOLTAGE TO MULTIPLE AMPLIFIERS BY USING SWITCHING REGULATOR

(71) Applicant: SAMSUNG ELECTRONICS CO., LTD., Suwon-si, Gyeonggi-do (KR)

(72) Inventors: Jooseung Kim, Suwon-si (KR); Dongil Yang, Suwon-si (KR); Youngmin Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/665,327

(22) Filed: Oct. 28, 2019

(65) Prior Publication Data

US 2020/0136562 A1  Apr. 30, 2020

(30) Foreign Application Priority Data

Oct. 26, 2018  (KR) .................. 10-2018-0129271

(51) Int. Cl.
| | | |
|---|---|---|
| H04B 1/04 | (2006.01) | |
| H03F 1/02 | (2006.01) | |
| G05F 1/56 | (2006.01) | |
| H03F 1/26 | (2006.01) | |
| H03F 3/193 | (2006.01) | |

(Continued)

(52) U.S. Cl.
CPC ............. *H03F 1/0227* (2013.01); *G05F 1/56* (2013.01); *H03F 1/26* (2013.01); *H03F 3/193* (2013.01); *H03F 3/211* (2013.01); *H03F 3/68* (2013.01); *H03F 2200/102* (2013.01)

(58) Field of Classification Search
CPC .......... H03F 1/0227; H03F 1/26; H03F 3/193; H03F 3/211; H03F 3/68; G05F 1/56; H04B 2001/0408
See application file for complete search history.

(56) References Cited

U.S. PATENT DOCUMENTS

| | | |
|---|---|---|
| 8,598,950 B2 | 12/2013 | Khesbak |
| 9,445,371 B2 | 9/2016 | Khesbak et al. |
| 9,614,477 B1 * | 4/2017 | Rozenblit ............. H03F 1/0227 |

(Continued)

FOREIGN PATENT DOCUMENTS

KR   10-2016-0028943   3/2016

OTHER PUBLICATIONS

European Extended Search Report dated Feb. 17, 2020 for EP Application No. 19205731.3.

(Continued)

*Primary Examiner* — Tuan Pham
(74) *Attorney, Agent, or Firm* — Nixon & Vanderhye P.C.

(57) ABSTRACT

Various embodiments disclose a method and a device including: an antenna, a switching regulator, communication chip including an amplifier and a linear regulator operably connected to the amplifier and the switching regulator, the communication chip configured to transmit a radio-frequency signal from the electronic device through the antenna, and control circuitry configured to control the communication chip such that the linear regulator provides the amplifier with a voltage corresponding to an envelope of an input signal input to the amplifier, the input signal corresponding to the radio-frequency signal.

19 Claims, 14 Drawing Sheets

(51) Int. Cl.
*H03F 3/21* (2006.01)
*H03F 3/68* (2006.01)

(56) References Cited

U.S. PATENT DOCUMENTS

| | | |
|---|---|---|
| 9,843,294 B2 | 12/2017 | Khlat |
| 2012/0326783 A1 | 12/2012 | Mathe et al. |
| 2013/0135043 A1 | 5/2013 | Hietala et al. |
| 2014/0285164 A1* | 9/2014 | Oishi .................. H03F 1/0222 323/266 |
| 2015/0098523 A1 | 4/2015 | Lim et al. |
| 2015/0146819 A1* | 5/2015 | Chowdhury .......... H03F 1/0227 375/296 |
| 2016/0065139 A1 | 3/2016 | Lee et al. |
| 2017/0194915 A1 | 7/2017 | Wimpenny |
| 2017/0212721 A1 | 7/2017 | Satoskar et al. |
| 2018/0152144 A1 | 5/2018 | Choo et al. |

OTHER PUBLICATIONS

PCT International Search dated Feb. 5, 2020 for PCT/KR2019/014309.
PCT Written Opinion dated Feb. 5, 2020 for PCT/KR2019/014309.
European Office Action dated Aug. 31, 2020 for European Application No. 19205731.3.

* cited by examiner

METHOD AND DEVICE FOR SELECTIVELY SUPPLYING VOLTAGE TO MULTIPLE AMPLIFIERS BY USING SWITCHING REGULATOR

CROSS-REFERENCE TO RELATED APPLICATION

This application is based on and claims priority under 35 U.S.C. § 119 to Korean Patent Application No. 10-2018-0129271, filed on Oct. 26, 2018, in the Korean Intellectual Property Office, the disclosure of which is incorporated by reference herein in its entirety.

BACKGROUND

1) Field

The disclosure relates to a method and a device for selectively supplying a voltage to multiple amplifiers using a switching regulator.

2) Description of Related Art

Development of wireless communication systems has been directed to supporting higher data transmission rates in order to satisfy the ever-increasing demands for wireless data traffic. In order to support a high data transmission rate, a wide signal bandwidth and a complicated signal modulation scheme are necessary, thereby increasing the peak-to-average power ratio (PAPR). Therefore, a power amplifier that consumes a large amount of power inside an electronic device needs to have high-efficiency and high-linearity characteristics.

In order to have high-efficiency and high-linearity characteristics with regard to wideband and high-PAPR signals, envelope tracking (ET) technology has been applied to fourth-generation (4G) communication systems. Unlike conventional amplifiers that use fixed power supply voltages, the ET technology applies an envelope signal of an RF input signal, which is applied to an amplifier (for example, an RF power amplifier), as a power supply voltage of the amplifier, thereby reducing power consumption. Since the ET technology adjusts the envelope signal such that the voltage (Vcc) applied to the amplifier tracks the envelope of the RF signal, power dissipation is minimized, thereby enabling the amplifier to operate with a high efficiency. The amplifier generates a third-order inter modulation distortion (IMD3) during signal amplification, and the third-order inter modulation distortion may have a sweet spot point. The amplifier, if the ET technology is applied thereto, can have higher linearity characteristics than conventional power amplifiers due to Vcc shaping that enables tracking the sweet spot.

Evolution of wireless communication systems from the third generation (3G) to 4G has been followed by an abrupt increase in the transmission rate and active development of differentiated services in the mobile service market. However, evolution of mobile communication networks has not stopped there, and there has been fully-fledged research on new 5G mobile communication, such as enhanced mobile-broadband (eMBB), ultra-reliable & low latency communication (URLLC), and massive machine-type communication (mMTC), domestically and internationally. Actual implementation of 5G mobile communication may be largely divided into Sub6 5G and mmWave 5G. Compared with 4G LTE signals, the Sub6 5G and mmWave 5G have more complicated signal modulation schemes for faster super-high data transmission, and thus have wider bandwidths and larger PAPRs. Wider signal bandwidths make it difficult to develop modulators that are capable of tracking, but there is an increasing demand for the ET technology because transmitting signals having large PAPRs further decrease the efficiency of the RF power amplifier. For this reason, developers of RF system chipset solutions and ET modulators are focusing on developing wideband ET modulators such that the ET technology can be applied to 5G.

The above information is presented as background information only to assist with an understanding of the disclosure. No determination has been made, and no assertion is made, as to whether any of the above might be applicable as prior art with regard to the disclosure.

SUMMARY

Embodiments of the disclosure may disclose a method and a device wherein a linear regulator of an envelope tracking (ET) modulator is included in a transmission circuitry such that ET technology can be applied to signals having wide bandwidths without any and/or decreased limitation on the distance between the ET modulator and the transmission circuitry.

An electronic device according to various example embodiments may include: an antenna, a switching regulator, communication chip including an amplifier and a linear regulator operably connected to the amplifier and the switching regulator, the communication chip configured to transmit a radio-frequency signal from the electronic device through the antenna, and control circuitry configured to control the communication chip such that the linear regulator provides the amplifier with a voltage corresponding to an envelope of an input signal input to the amplifier, the input signal corresponding to the radio-frequency signal.

An electronic device according to various example embodiments may include: an antenna, a switching regulator, an amplifier operably connected to the switching regulator, a linear regulator operably connected to the switching regulator and the amplifier, and an envelope tracking digital-analog converter (ET DAC) configured to control the linear regulator to provide the amplifier with a voltage corresponding to an envelope of an input signal input to the amplifier, the input signal corresponding to a radio-frequency signal to be transmitted through the antenna, wherein a first electric path between the switching regulator and the linear regulator is longer than a second electric path between the linear regulator and the amplifier.

A communication chip for mounting on a circuit board of an electronic device to amplify a radio-frequency signal to be transmitted or received through an antenna of the electronic device according to various example embodiments may include: an amplifier, and a linear regulator configured to control a switching regulator of the electronic device to provide the amplifier with a voltage corresponding to an envelope of an input signal input to the amplifier, the input signal corresponding to a radio-frequency signal to be transmitted through the antenna.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
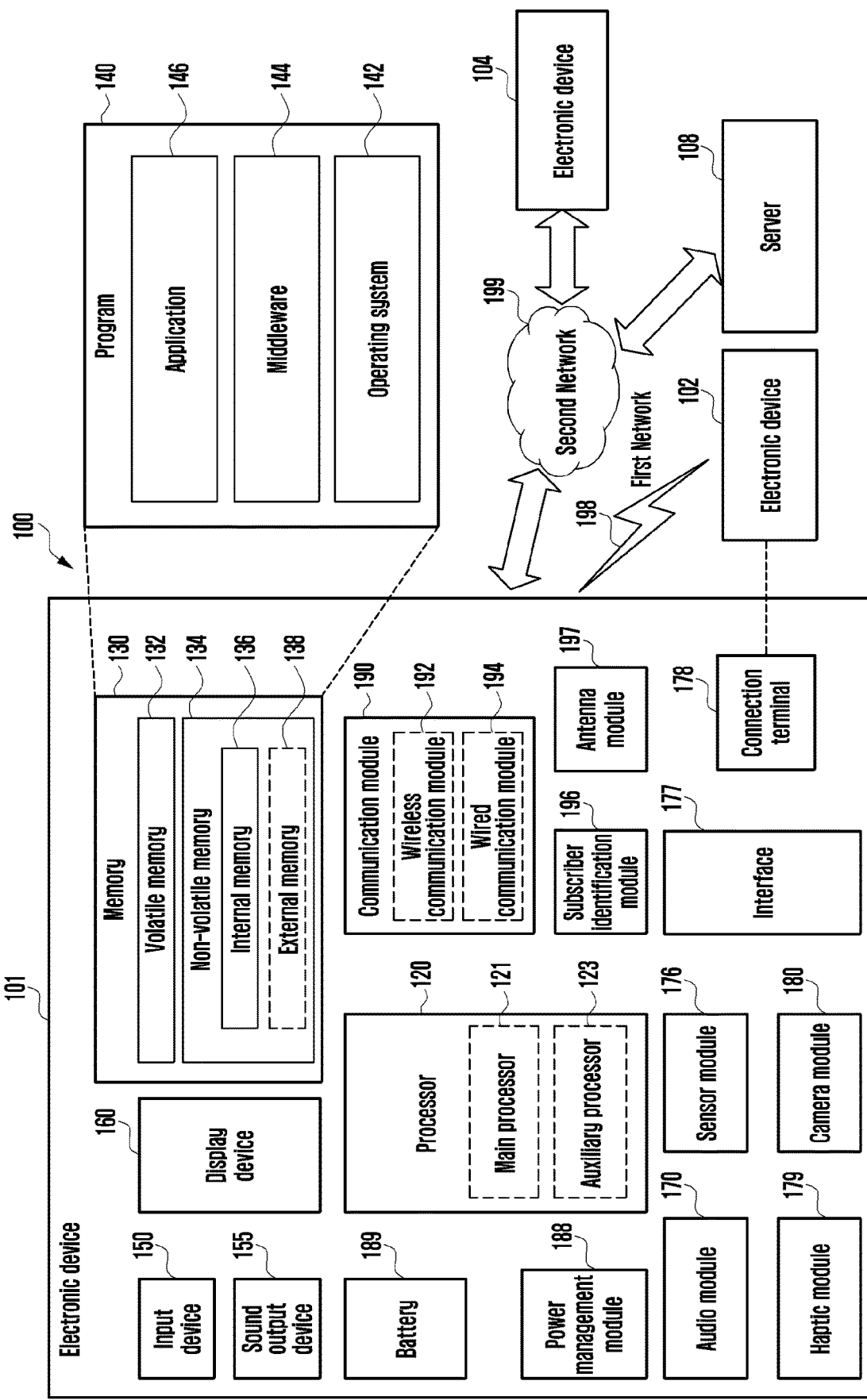
FIG. 1 is a block diagram illustrating an example electronic device in a network environment according to various embodiments.

The electronic device according to various embodiments may be one of various types of electronic devices. The electronic devices may include, for example, and without limitation, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combinations thereof and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
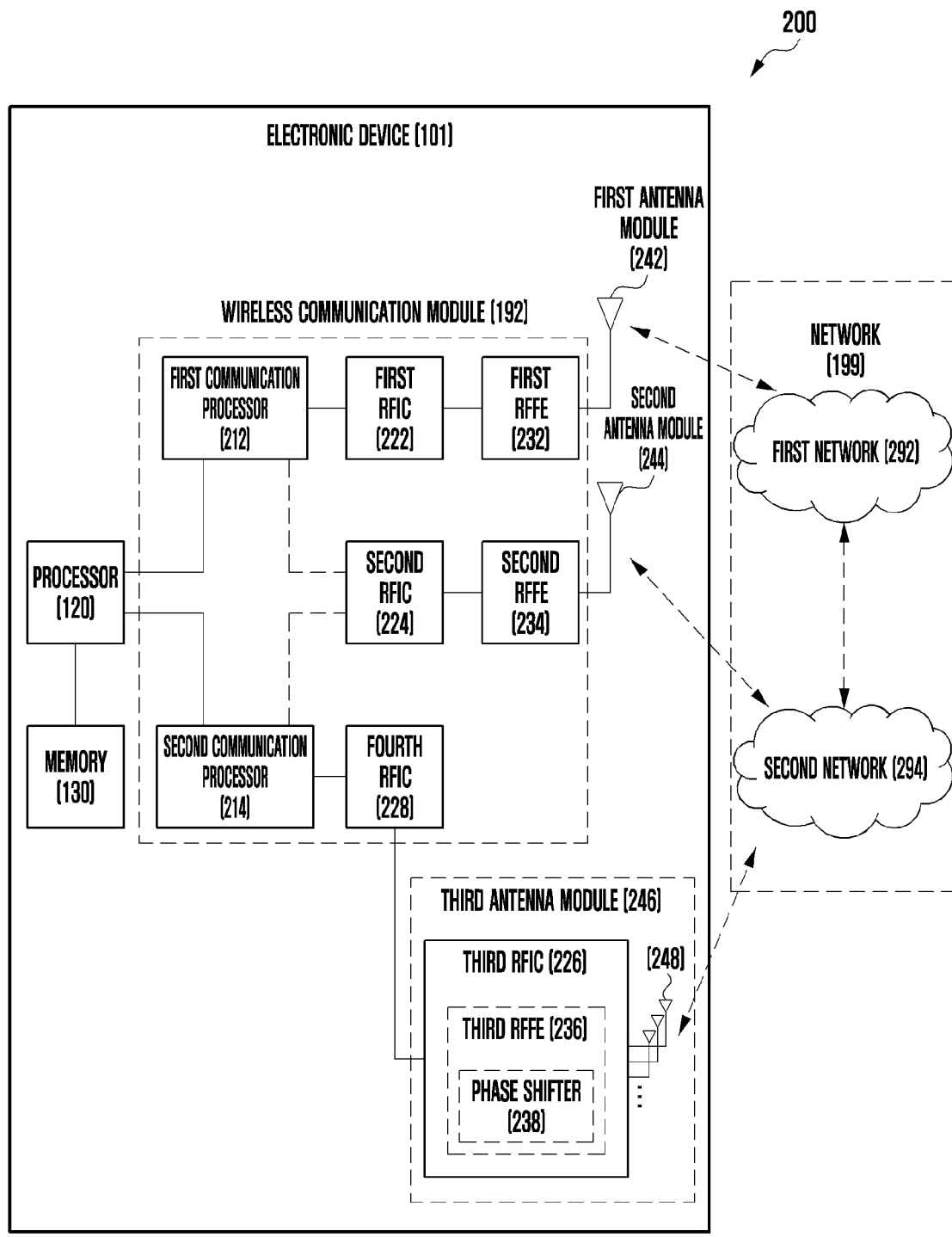
FIG. 2 is a block diagram illustrating an example electronic device for supporting legacy network communication and 5G network communication according to various embodiments.

FIG. 2 is a block diagram 200 illustrating an example electronic device 101 for supporting legacy network communication and 5G network communication according to various embodiments.

Referring to FIG. 2, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module (e.g., including at least one antenna) 242, a second antenna module (e.g., including at least one antenna) 244, and an antenna 248. The electronic device 101 may further include a processor (e.g., including processing circuitry) 120 and a memory 130.

The network 199 may include a first network (e.g., a legacy network) 292 and a second network (e.g., a 5G network) 294. According to another embodiment, the electronic device 101 may further include at least one component among the components illustrated in FIG. 1, and the network 199 may further include at least one different network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to another embodiment, the fourth RFIC 228 may be omitted or included as a part of the third RFIC 226.

The first communication processor 212 may include various communication processing circuitry and support establishment of a communication channel in a band to be used for wireless communication with the first network 292, and legacy network communication through the established communication channel. According to various embodiments, the first network may be a legacy network including, for example, and without limitation, a 2G, 3G, 4G, or long term evolution (LTE) network. The second communication processor 214 may support establishment of a communication channel corresponding to a designated band (for example, about 6 GHz to about 60 GHz) among bands to be used for wireless communication with the second network 294, and, for example, and without limitation, 5G network communication through the established communication channel. According to various embodiments, the second network 294 may, for example, be a 5G network as referenced by third generation partnership project (3GPP). Additionally, according to an embodiment, the first communication processor 212 or the second communication processor 214 may support establishment of a communication channel corresponding to another designated band (for example, about 6 GHz or lower) among the bands to be used for wireless communication with the second network 294, and, for example, 5G network communication through the established communication channel. According to an embodiment, the first communication processor 212 and the second communication processor 214 may be implemented inside a single chip or a single package. According to various embodiments, the first communication processor 212 or the second communication processor 214 may, for example, be provided inside a single chip or a single package together with a processor 120, an auxiliary processor 123, or a communication module 190.

The first RFIC 222 may convert a baseband signal generated by the first communication processor 212 into a radio frequency (RF) signal at about 700 MHz to about 3 GHz, which may be used for the first network 292 (for example, legacy network), during transmission. During reception, an RF signal may be acquired from the first network 292 (for example, legacy network) through an antenna (for example, the first antenna module 242), and may be preprocessed through an RFFE (for example, the first RFFE 232). The first RFIC 222 may convert the preprocessed RF signal into a baseband signal such that the same can be processed by the first communication processor 212.

The second RFIC 224 may convert a baseband signal generated by the first communication processor 212 or the second communication processor 214 into an RF signal in a Sub6 band (for example, about 6 GHz or lower) (hereinafter, referred to as a 5G Sub6 RF signal) that may be used for the second network 294 (for example, 5G network). During reception, a 5G Sub6 RF signal may be acquired from the second network 294 (for example, 5G network) through an antenna (for example, the second antenna module 244), and may be preprocessed through an RFFE (for example, the second RFFE 234). The second RFIC 224 may convert the preprocessed 5G Sub6 RF signal into a baseband signal such that the same can be processed by a communication processor corresponding to the first communication processor 212 or the second communication processor 214.

The third RFIC 226 may convert a baseband signal generated by the second communication processor 214 into an RF signal in a 5G Above6 band (for example, about 6 GHz to about 60 GHz) (hereinafter, referred to as a 5G Above6 signal) that is to be used for the second network 294 (for example, 5G network). During reception, a 5G Above6 RF signal may be acquired from the second network 294 (for example, 5G network) through an antenna (for example, the antenna 248), and may be preprocessed through the third RFFE 236. The third RFIC 226 may convert the preprocessed 5G Above6 signal into a baseband signal such that the same can be processed by the second communication processor 214. According to an embodiment, the third RFFE 236 may be formed as a part of the third RFIC 226.

According to an embodiment, the electronic device 101 may include a fourth RFIC 228 separately from the third RFIC 226 or as at least a part thereof. In this example, the fourth RFIC 228 may convert a baseband signal generated by the second communication processor 214 into an RF signal in an intermediate frequency band (for example, about 9 GHz to about 11 GHz) (hereinafter, referred to as an IF signal) and then deliver the IF signal to the third RFIC 226. The third RFIC 226 may convert the IF signal into a 5G Above6 RF signal. During reception, a 5G Above6 RF signal may be received from the second network 294 (for example, 5G network) through an antenna (for example, antenna 248) and converted into an IF signal by the third RFIC 226. The fourth RFIC 228 may convert the IF signal into a baseband signal such that the same can be processed by the second communication processor 214.

According to an embodiment, the first RIFC 222 and the second RFIC 224 may, for example, be implemented as at least a part of a single chip or a single package. According to an embodiment, the first RFFE 232 and the second RFFE 234 may, for example, be implemented as at least a part of a single chip or a single package. According to an embodiment, at least one antenna module of the first antenna module 242 or the second antenna module 244 may be omitted or coupled to another antenna module so as to process RF signal in multiple corresponding bands.

According to an embodiment, the third RFIC 226 and the antenna 248 may be arranged on the same substrate so as to form a third antenna module 246. For example, the wireless communication module 192 or the processor 120 may be arranged on a first substrate (for example, main PCB). In this example, the third RFIC 226 may be formed on a partial area (for example, lower surface) of a second substrate (for example, sub PCB) that is separate from the first substrate, and the antenna 248 may be arranged in another partial area (for example, upper surface), thereby forming a third antenna module 246. The third RFIC 226 and the antenna 248 may be arranged on the same substrate such that the length of the transmission line between the same can be reduced. This may reduce loss (for example, attenuation) of a signal in a high-frequency band (for example, about 6 GHz to about 60 GHz) used for 5G network communication, for example, due to the transmission line. Accordingly, the electronic device 101 may improve the quality or speed of communication with the second network 294 (for example, 5G network).

According to an embodiment, the antenna 248 may, for example, include an antenna array including multiple antenna elements that may be used for beamforming. In this example, the third RFIC 226 may include multiple phase shifters 238 corresponding to the multiple antenna elements, as a part of the third RFFE 236, for example. During transmission, each of the multiple phase shifters 238 may shift the phase of a 5G Above6 RF signal, which is to be transmitted to the outside (for example, base station of 5G network) of the electronic device 101, through a corresponding antenna element. During reception, each of the multiple phase shifters 238 may shift the phase of a 5G Above6 RF signal received from the outside into the same or substantially same phase through a corresponding antenna element. This enables transmission or reception through beamforming between the electronic device 101 and the outside.

The second network 294 (for example, 5G network) may be operated independently of the first network 292 (for example, legacy network) (for example, standalone (SA)), or operated while being connected thereto (for example, non-standalone (NSA)). For example, the 5G network may include an access network (for example, 5G radio access network (RAN) or next-generation network (NG RAN)) and may not include a core network (for example, next-generation core (NGC)). In this example, the electronic device 101 may access the access network of the 5G network and then access an external network (for example, Internet) under the control of the core network (for example, evolved packed core (EPC)) of the legacy network. Protocol information (for example, LTE protocol network) for communication with the legacy network or protocol information (for example, new radio (NR) protocol information) for communication with the 5G network may be stored in the memory 130, and may be accessed by another component (for example, the processor 120, the first communication processor 212, or the second communication processor 214).

Figure 3:
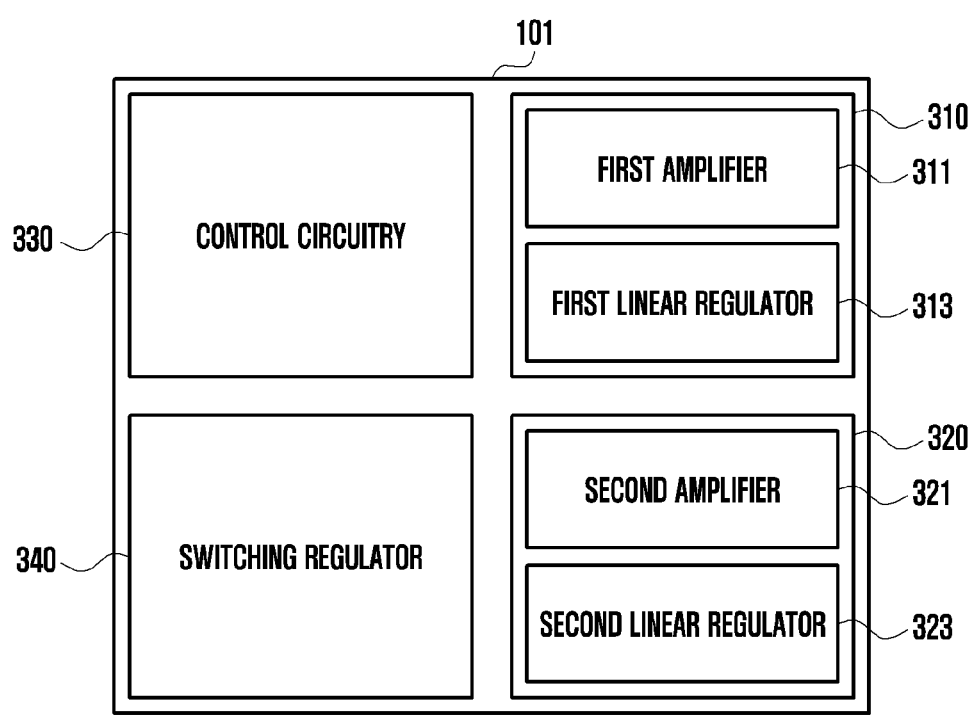
FIG. 3 is a block diagram illustrating an example configuration of an electronic device having an ET modulator applied to a transmission circuitry according to various embodiments.

FIG. 3 is a block diagram illustrating an example configuration of an electronic device having an ET modulator applied to a transmission circuitry according to various embodiments.

Referring to FIG. 3, the electronic device according to various embodiments (for example, the electronic device 101 in FIG. 1) may include a first transmission circuitry 310, a second transmission circuitry 320, a control circuitry 330, and a switching regulator 340.

The first transmission circuitry 310 (for example, the first RFFE 232 in FIG. 2) may include a first amplifier 311 and a first linear regulator 313. The first transmission circuitry 310 may encode an RF signal (for example, a first transmission signal) associated with communication (for example, wireless communication), may modulate the same in conformity with the transmission scheme, and may output the same. The RF signal input to the first transmission circuitry 310 from the wireless communication module (for example, the wireless communication module 192 in FIG. 1 or the first communication processor 212 in FIG. 2) may have the level of a weak signal having low-gain low-output power. Since the RF signal may have severe signal attenuation or noise, the first transmission circuitry 310 may amplify the power of the RF signal, when transmitting the RF signal to a base station, and then transmit the same, in order to improve the transmission efficiency against the signal attenuation or noise.

According to various embodiments, the first transmission circuitry 310 may amplify a first transmission signal (for example, an RF input signal) into a signal having high gain and high output (for example, an RF output signal) using the first amplifier 311. The first amplifier 311 may be configured to amplify the first transmission signal. The first amplifier 311 may provide loading energy to a weak signal (for example, an AC signal) using a power supply (for example, fixed power supply voltage) from the power management module (for example, the power management module 188 in FIG. 1) of the electronic device 101 so as to make a larger AC waveform, thereby amplifying the first transmission signal. If the first amplifier 311 amplifies the first transmission signal using a fixed power supply, unnecessary power dissipation may occur. Since the first amplifier 311 consumes a large amount of power in the electronic device 101, the same may need to have high-efficiency and high-linearity characteristics. In order for the first amplifier 311 to have high-efficiency and high-linearity characteristics, envelope tracking (ET) technology may be applied to the first amplifier 311.

According to various embodiments, the ET technology may refer, for example, to a technology of applying an envelope signal of an RF input signal, which is input to an amplifier (for example, the first amplifier 311 or the second amplifier 321), as a power supply voltage of the first amplifier 311 or the second amplifier 321, thereby reducing the power consumption. Since the ET technology adjusts the envelope signal such that the voltage (Vcc) applied to the amplifier tracks the RF envelope, power dissipation is minimized and/or reduced, thereby ensuring that the amplifier operates with a high efficiency. An ET modulator to which the ET technology is applied may include a linear regulator, a comparator, or a switching regulator, and the first transmission circuitry 310 may include the linear regulator (for example, first linear regulator 313) or the comparator (for example, first comparator (not illustrated)) included in the ET modulator.

According to various embodiments, no comparator is separately illustrated in FIG. 3 but, since the first linear regulator 313 controls the input to the switching regulator (for example, the switching regulator 340 in FIG. 3), it may be understood that the first linear regulator 313 may include a comparator. The first comparator may compare an input voltage with a reference voltage, may detect whether the input exceeds the reference voltage, and may output the result as a digital value (for example, 0 or 1). For example, the first comparator may compare the output from the switching regulator 340 and the output from the first linear regulator 313 and may output a digital value of, for example, 0 or 1.

According to various embodiments, the first linear regulator 313 may be configured to supply a first voltage to the first amplifier 311, based on an envelope corresponding to a first designated frequency band of the first transmission signal. The first linear regulator 313, which controls (or adjusts) a voltage, is designed to operate with a linear relation between input and output. Since the first linear regulator 313 has high-speed characteristics, the same can amplify a high-frequency signal among envelope signals of an input signal applied to the first amplifier 311. For example, the first linear regulator 313 may control (or adjust) the first voltage such that the first voltage applied to the first amplifier 311 tracks (or follows) the envelope corresponding to the first designated frequency band. By adjusting the first voltage to correspond to the envelope, the first linear regulator 313 may reduce power used by the first amplifier 311 to amplify the first transmission signal.

According to various embodiments, the first linear regulator 313 may regulate and thus compensate for noise generated by the switching regulator 340. Even if a low-frequency signal from the switching regulator 340 may be distorted by a trace (for example, a signal line through which a signal from the switching regulator 340 is delivered), the first linear regulator 313 regulates the same and thus generates an envelope signal. Accordingly, an inductance resulting from the distance between the switching regulator 340 and the first amplifier 311 may not be considered.

According to various embodiments, the first designated frequency band may be a frequency band configured in the first transmission circuitry 310. For example, the first designated frequency band may be at least one of a band of about 700 MHz to about 3 GHz used for the first network (for example, the first network 292 in FIG. 2, or a legacy network), a Sub6 band (for example, about 6 GHz or lower) used for a second network (for example, the second network 294 in FIG. 2 or a 5G network), an intermediate frequency band (for example, about 9 HHz to about 11 GHz), or a 5G Above6 band (for example, about 6 HGz to 60 GHz).

The second transmission circuitry 320 (for example, the RFFE 234 in FIG. 2) may include a second amplifier 321 and a second linear regulator 323. The second transmission circuitry 320 may encode an RF signal (for example, a second transmission signal) associated with communication (for example, wireless communication), may modulate the same in conformity with the transmission scheme, and may output the same. The RF signal input to the second transmission circuitry 320 from the wireless communication module 192 (for example, the first communication processor 212 or the second communication processor 214 in FIG. 2) may have the level of a weak signal having low-gain low-output power. The second transmission circuitry 320 may amplify the second transmission signal (for example, an RF input signal) into a signal having high gain and high output (for example, an RF output signal) using the second amplifier 321. The second amplifier 321 may be configured to amplify the second transmission signal. The second amplifier 321 may load energy to a weak signal (for example, an AC signal) by applying a power supply (for example, fixed power supply voltage) from the power management module (for example, the power management module 188 in FIG. 1) of the electronic device 101 such that a larger AC waveform is made, thereby amplifying the second transmission signal.

According to various embodiments, the second transmission circuitry 320 may include a linear regulator (for example, a second linear regulator 323) or a comparator (for example, a second comparator (not illustrated)), which is included in the ET modulator. Although no comparator is separately illustrated in FIG. 3, the second linear regulator 323 controls the input to the switching regulator 340, and it may be accordingly understood that the comparator may be included in the second linear regulator 323. The second comparator may compare an input voltage with a reference voltage, may detect whether the input exceeds the reference voltage, and may output the result as a digital value (for example, 0 or 1).

According to various embodiments, the second linear regulator 323 may be configured to supply a second voltage to the second amplifier 321, based on an envelope corresponding to a second designated frequency band of the second transmission signal. The second linear regulator 323 may amplify a high-frequency signal among envelope signals of an input signal applied to the second amplifier 321. For example, the second linear regulator 323 may control (or adjust) the second voltage such that the second voltage applied to the second amplifier 321 tracks the envelope corresponding to the second designated frequency band. By adjusting the second voltage to correspond to the envelope, the second linear regulator 323 may reduce power used by the second amplifier 321 to amplify the second transmission signal. In addition, the second linear regulator 323 may regulate and thus compensate for noise generated by the switching regulator 340.

According to various embodiments, the second designated frequency band may be a frequency band configured in the second transmission circuitry 320. The second designated frequency band may be identical to the first designated frequency band or different therefrom. For example, the second designated frequency band may be at least one of a band of about 700 MHz to about 3 GHz used for the first network 292 (for example, a legacy network), a Sub6 band (for example, about 6 GHz or lower) used for a second network 294 (or a 5G network), an intermediate frequency band (for example, about 9 HHz to about 11 GHz), or a 5G Above6 band (for example, about 6 HGz to 60 GHz).

The switching regulator 340 may be electrically connected to the first amplifier 311 and the second amplifier 321. The switching regulator 340, which adjusts (or controls) a voltage, may supply a desired voltage while turning a switch element (for example, a MOSFET) on or off. The switching regulator 340 may amplify a low-frequency signal among envelope signals of an input signal applied to the first amplifier 311 and the second amplifier 321. The switching regulator 340 may turn the switch element on or off under the control of the control circuitry 330.

The control circuitry 330 may be configured such that, when the first transmission signal is transmitted to an external electronic device (for example, the electronic device 102 or the electronic device 104 in FIG. 1) through the first transmission circuitry 310, a third voltage is supplied to the first amplifier 311 using the switching regulator 340, based on an envelope corresponding to a third frequency band that is lower than the first designated frequency band of the first transmission signal. The control circuitry 330 may be configured such that, when the second transmission signal is transmitted to the external electronic device through the second transmission circuitry 320, a fourth voltage is supplied to the second amplifier 321 using the switching regulator 340, based on an envelope corresponding to the third frequency band that is lower than the second designated frequency band of the second transmission signal. According to various embodiments, the control circuitry 330 may refer, for example, to a comprehensive concept including a circuitry for controlling wireless communication according to various embodiments, such as a communication processor (for example, the processor 120, the first communication processor 212, or the second communication processor 214 in FIG. 2), an RFIC (for example, the first RFIC 222 or the second RFIC 224 in FIG. 2), a wireless communication module (for example, the wireless communication module 192 in FIG. 1 or FIG. 2), or an envelope tracking digital analog convertor (ET DAC).

According to various embodiments, the control circuitry 330 may control the third voltage such that the output voltage of the switching regulator 340 tracks an envelope corresponding to the third frequency band. The control circuitry 330 may control the fourth voltage such that the output voltage of the switching regulator 340 tracks an envelope corresponding to the fourth frequency band.

Although expressions such as "first" and "second" are used in FIG. 3 to distinguish the transmission circuitries (for example, the first transmission circuitry 310 and the second transmission circuitry 320), the amplifiers (for example, the first amplifier 311 and the second amplifier 321), and the linear regulators (for example, the first linear regulator 313 and the second linear regulator 323), these elements perform the same functions, and such a use of the expressions "first" and "second" is for facilitating recognition only, and does not limit the disclosure in any manner. In another embodiment, the first transmission circuitry 310 and the second transmission circuitry 320 may be configured to process signals in different frequency bands.

Figure 4A:
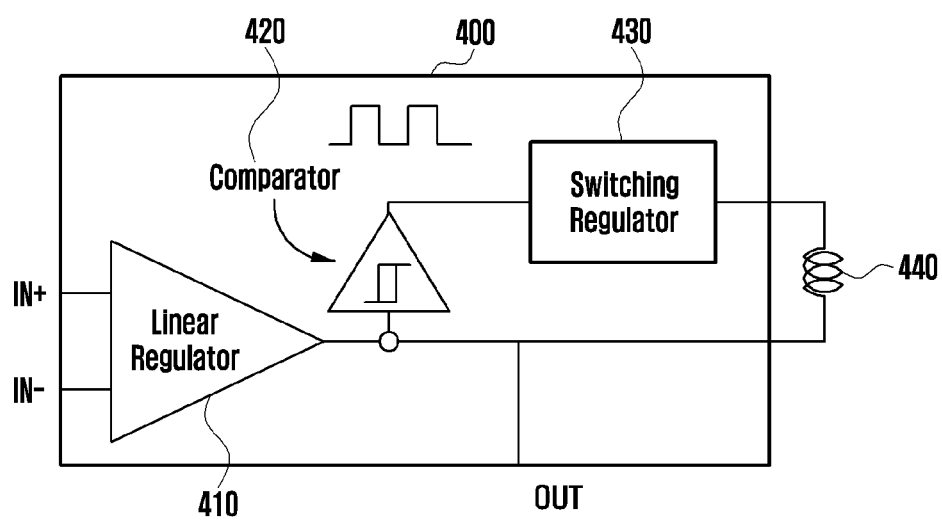
FIG. 4A is a diagram illustrating an example configuration of an ET modulator according to various embodiments.
Figure 4B:
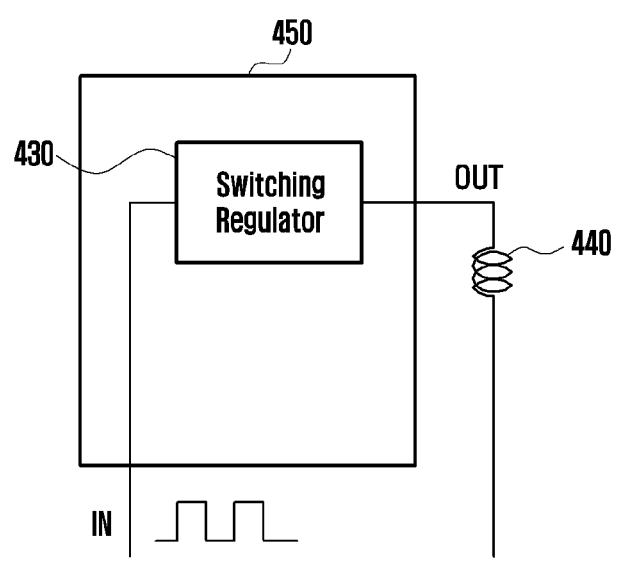
FIG. 4B is a diagram illustrating an example configuration of an ET modulator according to various embodiments.
Figure 4C:
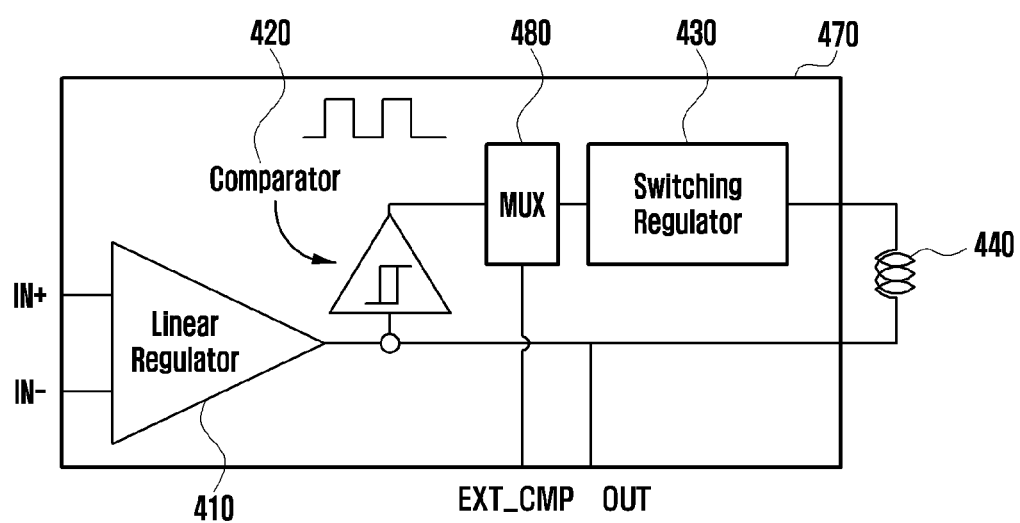
FIG. 4C is a diagram illustrating an example configuration of an ET modulator according to various embodiments.

FIG. 4A is a diagram illustrating an example configuration of an ET modulator according to various embodiments, FIG. 4B is a diagram illustrating an example configuration of an ET modulator according to various embodiments, and FIG. 4C is a diagram illustrating an example configuration of an ET modulator according to various embodiments.

Referring to FIG. 4A, the envelope tracking (ET) modulator 400 may apply an envelope signal of an input signal applied to an amplifier (for example, the first amplifier 311 or the second amplifier 321 in FIG. 3) as a power supply voltage of the first amplifier 311 or the second amplifier 321, thereby reducing the power consumption. Such an ET modulator 400 may include two types of different regulators (hybrid structure) in order to have high-efficiency and high-linearity characteristics. For example, the ET modulator 400 may include a linear regulator 410 and/or a switching regulator 430. The ET modulator 400 may include a comparator 420 configured to compare the output from the linear regulator 410 and to control the input to the switching regulator 430. The ET modulator 400 in FIG. 4A may, for example, be referred to as a "second type ET modulator".

The linear regulator 410 (for example, the first linear regulator 311 or the second linear regulator 321 in FIG. 3), which controls (or adjusts) a voltage, may compare an output voltage and a reference voltage and output a predetermined voltage. The linear regulator 410 is designed to operate with a linear relation between input and output. The linear regulator 410 may amplify a high-frequency signal among envelope signals of an input signal applied to the first amplifier 311 or the second amplifier 321.

According to various embodiments, the linear regulator 410 may regulate and thus compensate for noise generated by the switching regulator 430. For example, even if a low-frequency signal from the switching regulator 340 is distorted by a trace (for example, a signal line through which a signal from the switching regulator 340 is delivered), the linear regulator 410 may regulate the same and thus generate an envelope signal. The linear regulator 410 has high-speed characteristics and thus can track envelope signals in a wide bandwidth, but may have a low efficiency (for example, a small amount of current output). Since the linear regulator 410 has a high speed while the switching regulator 430 has a low speed, the linear regulator 410 may operate as a master that controls the switching regulator 430, and the switching regulator 430 may operate as a slave.

The comparator 420 plays the role of controlling the operating relation between the linear regulator 410 and the switching regulator 430. If the linear regulator 410 and the switching regulator 430 operate independently of each other, problems such as divergence or oscillation may occur. Accordingly, the current directionality of the linear regulator 410 is sensed through the comparator 420, and the on/off state of the switching regulator 430 is controlled accordingly. For example, if the linear regulator 410 is SOURCING a current by the output (OUT), the switching regulator 430 operates in an on state and, when SINKING a current, the switching regulator 430 operates in an off state. Accordingly, the input to the comparator 420 becomes an envelope signal, and the output therefrom becomes a digital signal. Therefore, since the input bandwidth of the comparator 420 increases in proportion to the bandwidth of the envelope signal, designing the comparator closer to the linear regulator 410 than the switching regulator 430 is more advantageous to simplifying wideband signals.

The switching regulator 430 (for example, the switching regulator 340 in FIG. 3), which adjusts (or controls) a voltage, is designed to supply a desired voltage while turning a switch element (for example, a MOSFET) on or off. The switching regulator 430 may amplify a low-frequency signal among envelope signals of an input signal applied to the amplifier (the first amplifier 311 or the second amplifier 321). For example, the switching regulator 430 may turn the switch element on until the output voltage reaches a necessary level such that power is supplied from the input to the output. If the output voltage reaches the desired level, the switching regulator 430 may turn the switch element off such that input power is not consumed. For example, if the switching regulator 430 turns the switch element on, power may be supplied to the output terminal (out) through an inductor 440 and, if the switch element is turned off, power accumulated in the inductor 440 may be supplied to the output terminal. If the switch element is turned on, the output power may increase and, if the switch element is turned off, the output power may decrease. Using this principle, the switching regulator 430 may control the output power. The switching regulator 430 may output a large amount of current (or voltage) (for example, high efficiency), but has a low speed, and thus may have difficulty in tracking envelope signals in a wide bandwidth.

Referring to FIG. 4B, the ET modulator 450 may be designed to include only the switching regulator 430. If the ET modulator 450 may be included in the electronic device (for example, the electronic device 101 in FIG. 1), the linear regulator 410 and the comparator 420 may be included in the transmission circuitry (for example, the first transmission circuitry 310 or the second transmission circuitry 320 in FIG. 3). The ET modulator 450 in FIG. 4B may be referred to as a "first type ET modulator".

Referring to FIG. 4C, the ET modulator 470 may include a linear regulator 410, a comparator 420, a switching regulator 430 and/or a multiplexer 480. The linear regulator 410 (for example, the first linear regulator 311 or the second linear regulator 321 in FIG. 3), the comparator 420, and the switching regulator 430 (for example, the switching regulator 340 in FIG. 3) have already been described in detail with reference to FIG. 3 and FIG. 4A, and repeated description thereof will not be provided here. The ET modulator 470 in FIG. 4C may be referred to as a "third type ET modulator".

The multiplexer 480 may be a combination circuitry configured to select one from multiple input lines and to connect the same to a single output line. Simply referred to as a "MUX", the multiplexer 480 has a single output in connection with multi-input data, and thus is also referred to as a data selector. If the ET modulator 470 is connected to at least two transmission circuitry, if one transmission circuitry includes a linear regulator, and if the other transmission circuitry does not include a linear regulator, the multiplexer 480 may control signals input to the switching regulator 430. For example, if the transmission circuitries include linear regulators (for example, the first transmission circuitry 310 and the second transmission circuitry 320 in FIG. 3), the multiplexer 480 may output signals (e.g., EXT_CMP) output from the linear regulators included in the transmission circuitries to the switching regulator 430 as input signals. If the transmission circuitries include no linear regulators, the multiplexer 480 may output signals output from the linear regulator 410 included in the ET modulator 470 to the switching regulator 430 as input signals.

Figure 5:
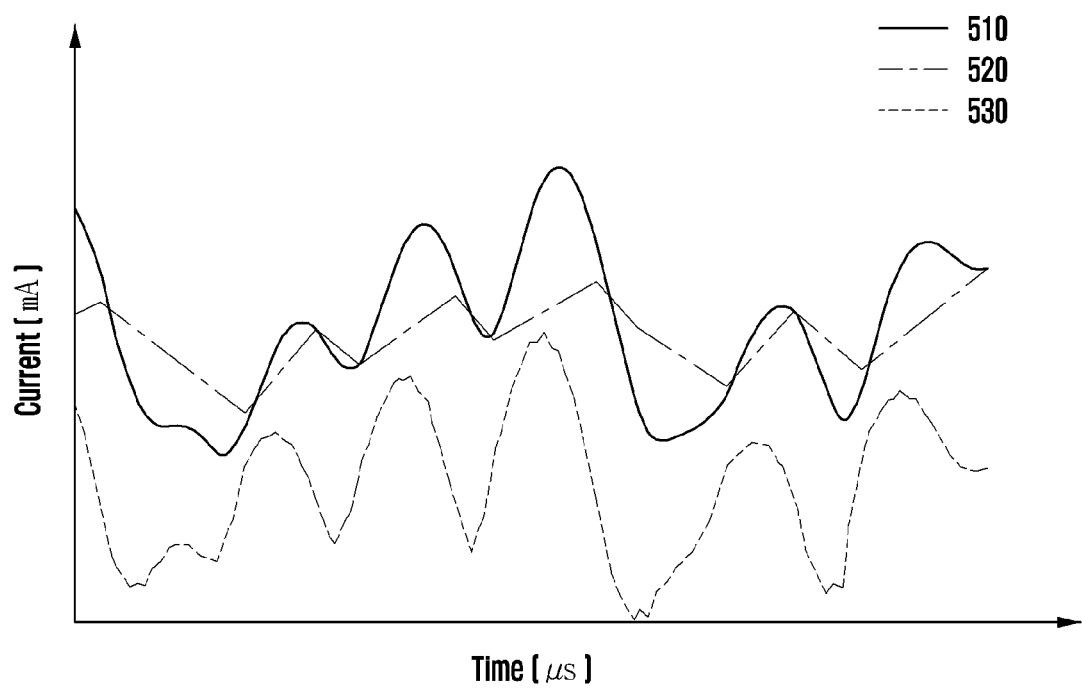
FIG. 5 is a diagram illustrating an example current graph of an ET modulator according to various embodiments.

FIG. 5 is a diagram illustrating an example current graph of an ET modulator according to various embodiments.

Referring to FIG. 5, the ET modulator (for example, the ET modulator 400 in FIG. 4A, the ET modulator 450 in FIG. 4B, or the ET modulator 470 of FIG. 4C) may control the switching regulator (for example, the switching regulator 340 in FIG. 3, or the switching regulator 430 in FIG. 4A to FIG. 4C) or the linear regulator (for example, the linear regulators 313 and 323 in FIG. 3 or the linear regulator 410 in FIG. 4A or FIG. 4C) so as to output an envelope signal 510. The envelope signal 510 may be generated using a low-frequency signal 520 generated by the switching regulator and a high-frequency signal 530 generated by the linear regulator. The ET modulator may control the envelope signal 510 applied to the amplifier (for example, the first amplifier 311 or the second amplifier 321 in FIG. 3) so as to reduce power consumed by the electronic device 101.

According to various embodiments, the comparator (for example, the comparator 420 in FIG. 4A to FIG. 4C) compares a current 530 output from the linear regulator (for example, the linear regulator 410 in FIG. 4A to FIG. 4C) with a comparative reference value, thereby generating a digital signal for controlling the switching regulator (for example, the switching regulator 340 in FIG. 3 or the switching regulator 430 in FIG. 4A and FIG. 4B). The digital signal is 1 or 0:1 corresponds to a signal for operating the switching regulator in an on state, and 0 corresponds to a signal for operating the same in an off state.

Figure 6A:
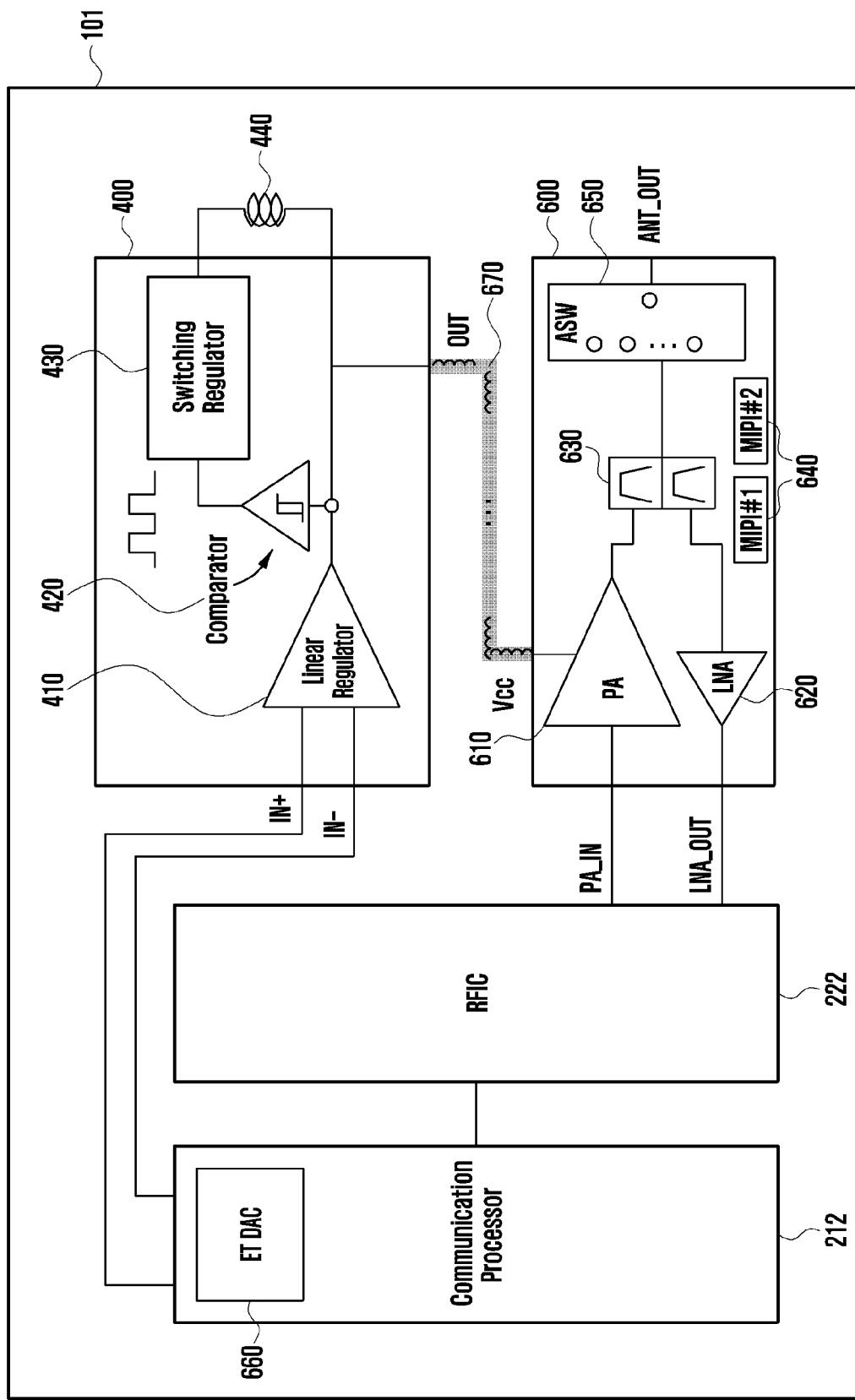
FIG. 6A is a diagram illustrating an example configuration of an electronic device having an ET modulator applied thereto according to an example embodiment.

FIG. 6A is a diagram illustrating an example configuration of an electronic device having an ET modulator applied thereto according to an example embodiment.

Referring to FIG. 6A, the electronic device according to an example (for example, the electronic device 101 in FIG. 1) may include a communication processor (for example, the first communication processor 212), an RFIC (for example, the RFIC 222 in FIG. 2), an ET modulator 400, and a transmission circuitry 600.

The communication processor 212 may include various processing circuitry and support establishment of a communication channel in a band to be used for wireless communication with a network (for example, the second network 199 in FIG. 1), and network communication through the established communication channel. According to various embodiments, the network may be a legacy network including, for example, and without limitation, a 2G, 3G, 4G, or long term evolution (LTE) network. The communication processor 212 may further include an envelope tracking digital analog converter (ET DAC) 660.

The ET DAC 660 may include an envelope detector and a digital signal processor (DSP). The envelope detector may convert an in-phase (I)/quadrature-phase (Q) signal into an envelope signal. The I/Q signal may refer, for example, to a signal having a modulated frequency, and may be input to the linear regulator 410 as an in-phase "I" signal having a phase of 0° and as an orthogonal "Q" signal having a phase of 90°. The digital signal processor may adjust the shaping or delay of the envelope signal output from the envelope detector. The amplifier may generate a third-order inter modulation distortion (IMD3) during signal amplification, and the third-order inter modulation distortion may have a sweet spot point. The shaping may correspond to tracking the sweet spot so as to control the envelope signal. The digital signal processor may control the envelope signal such that the envelope signal tracks the transmission signal amplified by the transmission circuitry 600. According to various embodiments, although the ET DAC 660 is illustrated in the diagram as being included in the communication processor 212, the ET DAC 660 may be included in the RFIC 222.

During transmission, the RFIC 222 may convert a baseband signal generated by the communication processor 212 into a radio frequency signal (for example, a frequency band of about 600 MHz to about 6 GHz) used for the network.

The ET modulator 400 may include a linear regulator 410, a comparator 420, and/or a switching regulator 430. The linear regulator 410 (the first linear regulator 311 or the second linear regulator 321 in FIG. 3), the comparator 420, and the switching regulator 430 (for example, the switching regulator 340 in FIG. 3) have already been described in detail with reference to FIG. 3 and FIG. 4A, and repeated description thereof will not be provided here.

The transmission circuitry 600 may include a power amplifier (PA) 610, a low-noise amplifier (LNA) 620, a filter/duplexer 630, multiple mobile industry processor interface (MIPI) controllers 640, and an antenna switch (ASW) 650. The power amplifier 610 (for example, the first amplifier 311 or the second amplifier 321 in FIG. 3) may amplify a transmission signal (e.g., PA_IN). The low-noise amplifier 620 may amplify a reception signal. The filter/duplexer 630 may be connected to the antenna (for example, the first antenna module 242 in FIG. 2) of the electronic device 101 so as to separate transmission/reception frequencies of the electronic device 101. The filter/duplexer 630 may include multiple filters or duplexers with regard to respective frequency bands. The multiple MIPI controllers 640 may control transmission signals or reception signals. The antenna switch (ASW) 650 may select a frequency band of signals to be transmitted/received. The antenna switch 650 may control switches according to the frequency band of signals to be transmitted/received.

Since the envelope signal output from the ET DAC 660 may be input to the ET modulator 400, distortion of the envelope signal input to the ET modulator 400 may become severe. The signal distortion may increase in proportion to the distance 670 (for example, the distance between the ET modulator 400 and the transmission circuitry 600) and in proportion to the signal bandwidth. Accordingly, the ET modulator 400 according to the comparative example may be mounted at a small, and preferably the smallest, distance 670 from the transmission circuitry 600. If ET technology is applied with regard to signals having a wide bandwidth of 100 MHz or larger, as in the case of 5G, fatal distortion may occur due to the distance 670 between the ET modulator 400 and the transmission circuitry 600.

Figure 6B:
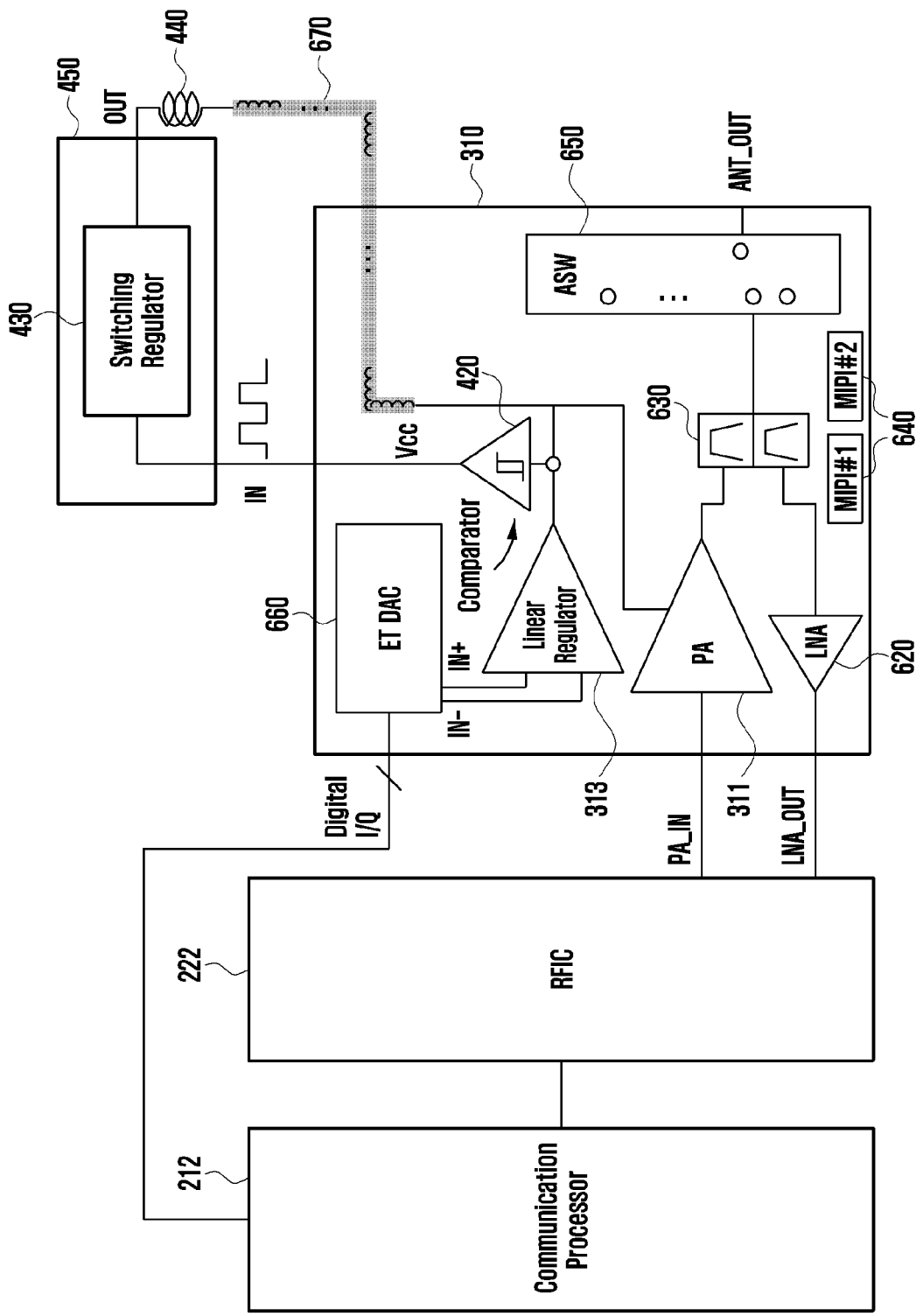
FIG. 6B is a diagram illustrating an example configuration of an electronic device having an ET modulator applied to a transmission circuitry according to various embodiments.

FIG. 6B is a diagram illustrating an example configuration of an electronic device having an ET modulator applied to a transmission circuitry according to various embodiments.

Referring to FIG. 6B, the electronic device (for example, the electronic device 101 in FIG. 1) according to the disclosure may include a communication processor (for example, the first communication processor 212), an RFIC (for example, the RFIC 222 in FIG. 2), an ET modulator 450, and a transmission circuitry 310 (for example, the transmission circuitry 310 in FIG. 3).

The communication processor 212 may include various processing circuitry and support establishment of a communication channel in a band to be used for wireless communication with a network (for example, the second network 294 in FIG. 2), and network communication through the established communication channel. According to various embodiments, the network may include, for example, and without limitation, a 2G, 3G, 4G, or long term evolution (LTE) network or a 5G network defined by third generation partnership project (3GPP).

The RFIC 222 may convert a baseband signal generated by the communication processor into a radio frequency signal (for example, about 6 HGz or lower) used for the network during transmission.

The ET modulator 450 may include a switching regulator 430. The ET modulator 450 may be the first type ET modulator illustrated in FIG. 4B. The switching regulator 430 has already been described in detail with reference to FIG. 3 or FIG. 4A, and repeated description thereof will not be repeated here.

The transmission circuitry 310 may include an amplifier 311 (for example, the first amplifier 311 or the second amplifier 321 in FIG. 3), a linear regulator 313 (for example, the first linear regulator 313 or the second linear regulator 323 in FIG. 3), a comparator 420 (for example, the comparator 420 in FIG. 4A), a low-noise filter 620, a filter/duplexer 630, multiple MIPI controllers 640, an antenna switch (ASW) 650, and/or an ET DAC 660. The ET DAC 660 may convert an I/Q signal into an envelope signal and input the same to the linear regulator 410 as an in-phase "I" signal having a phase of 0° and as an orthogonal "Q" signal having a phase of 90°. The elements of the transmission circuitry 310 have already been described in detail with reference to FIG. 3, FIG. 4A, and FIG. 6A, and repeated description thereof will not be repeated here.

According to various embodiments, since the envelope signal output from the ET DAC 660 included in the transmission circuitry 310 is directly input to the linear regulator 313 included in the transmission circuitry 310, there may be little or no distortion of the envelope signal. The signal distortion may increase in proportion to the distance 670 (for example, the distance between the ET modulator 440 and the transmission circuitry 310) and in proportion to the signal bandwidth. However, since the ET DAC 660 and the linear regulator 313 are included in the transmission circuitry 310, the linear regulator 313 outputs the final envelope signal with regard to a signal in a wide bandwidth of about 100 MHz or higher, as in the case of 5G, and there may be little or no signal distortion depending on the distance 670.

According to various embodiments, the amplifier 311 included in the transmission circuitry 310, the low-noise amplifier 620, the filter/duplexer 630, the multiple MIPI controllers 640, and the antenna switch (ASW) 650 may use, for example, a complementary metal-oxide-semiconductor (CMOS)/silicon on insulator (SOI) wafer process. In addition, the ET modulator including the linear regulator 313, the comparator 420, and the switching regulator 430 may, for example, also use the CMOS/SOI wafer process. Therefore, if the linear regulator 313 and the comparator 420, which are some of the elements of the ET modulator, are included in the transmission circuitry 310, the chip size does not change, and more efficient and cost-effective chip manufacturing may be facilitated.

Figure 7:
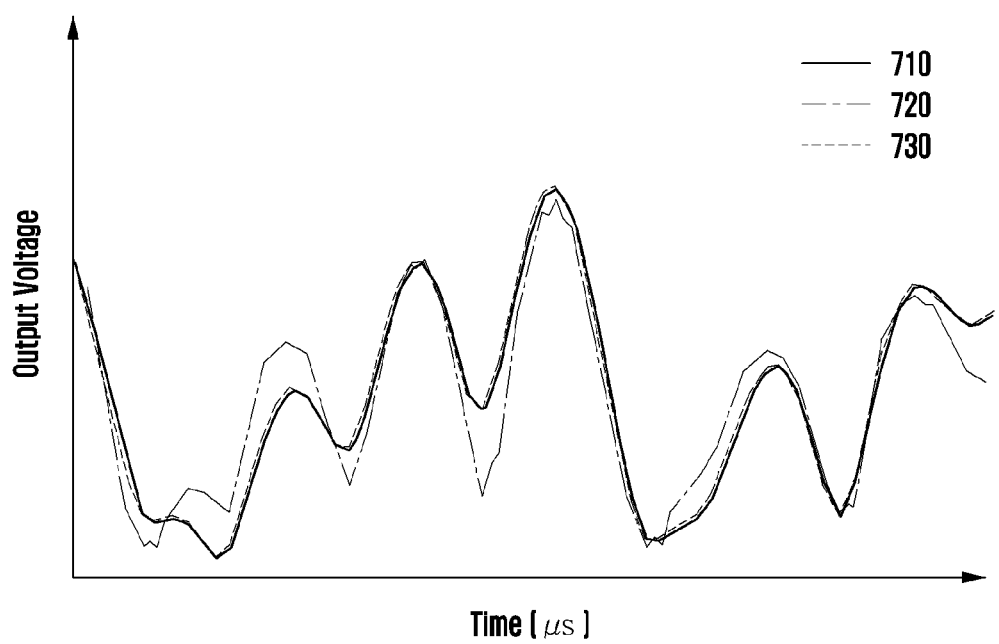
FIG. 7 is a diagram illustrating an example voltage measurement graph obtained by simulating an ET modulator according to various embodiments.

FIG. 7 is a diagram illustrating an example voltage measurement graph obtained by simulating an ET modulator according to various embodiments.

Referring to FIG. 7, the voltage measurement graph may be obtained by simulating the output voltage of an ET modulator (for example, the ET modulator 400 in FIG. 4A, the ET modulator 450 in FIG. 4B, or the ET modulator 470 in FIG. 4C). If the ET modulator supports a 100 MHz band signal, and if the circuitry is configured such that the distance between the ET modulator and the transmission circuitry is, for example, about 5 cm, the first signal 710 may be an envelope input signal, the second signal 720 may be a conventional envelope output signal, and the third signal 730 may be an envelope output signal according to the disclosure. According to the prior art, a signal output to a switching regulator (for example, the switching regulator 430 in FIG. 4A or FIG. 4C) after an envelope signal is generated by a linear regulator (for example, the linear regulator 410 in FIG. 4A or FIG. 4C) may be distorted due to inductance resulting from the long path (for example, the distance of 5 cm). The second signal 720 fails to track the first signal 710 due to distortion resulting from inductance. According to the disclosure, a linear regulator (for example, the first linear regulator 313 or the second linear regulator 323 in FIG. 3) is included in a transmission circuitry (for example, the first transmission circuitry 310 or the second transmission circuitry 320 in FIG. 3) such that the linear regulator outputs the final envelope signal. Although the third signal 730 has a distance of 5 cm from the wideband (for example, about 100 MHz band) signal, the third signal 730 has little or no distortion resulting from inductance and thus can track the first signal 710.

Figure 8:
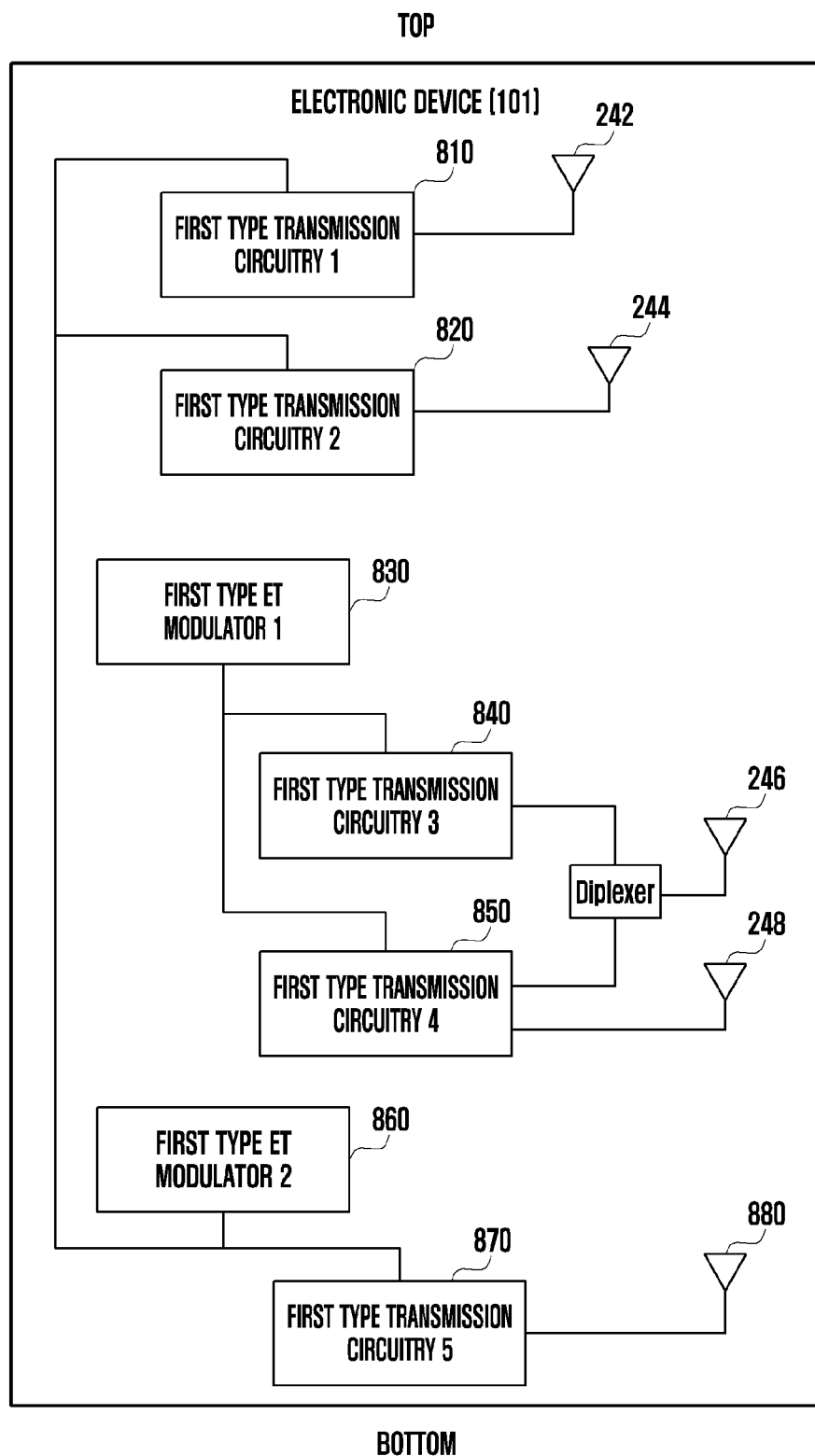
FIG. 8 is a diagram illustrating an example configuration of an electronic device including a transmission circuitry having an ET modulator applied thereto according to various embodiments.
Figure 9:
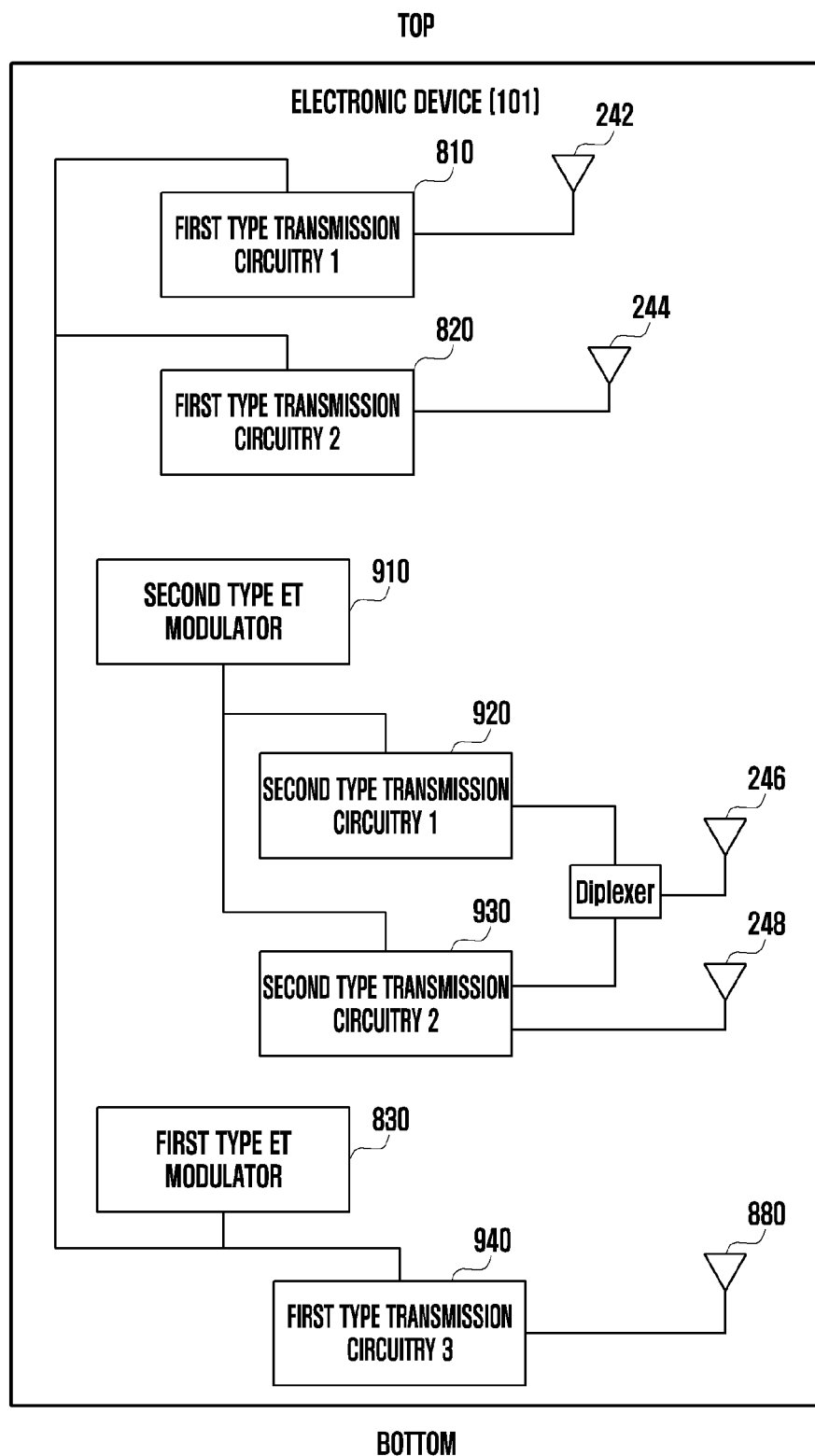
FIG. 9 is a diagram illustrating an example configuration of an electronic device including a transmission circuitry having an ET modulator applied thereto according to various embodiments.
Figure 10:
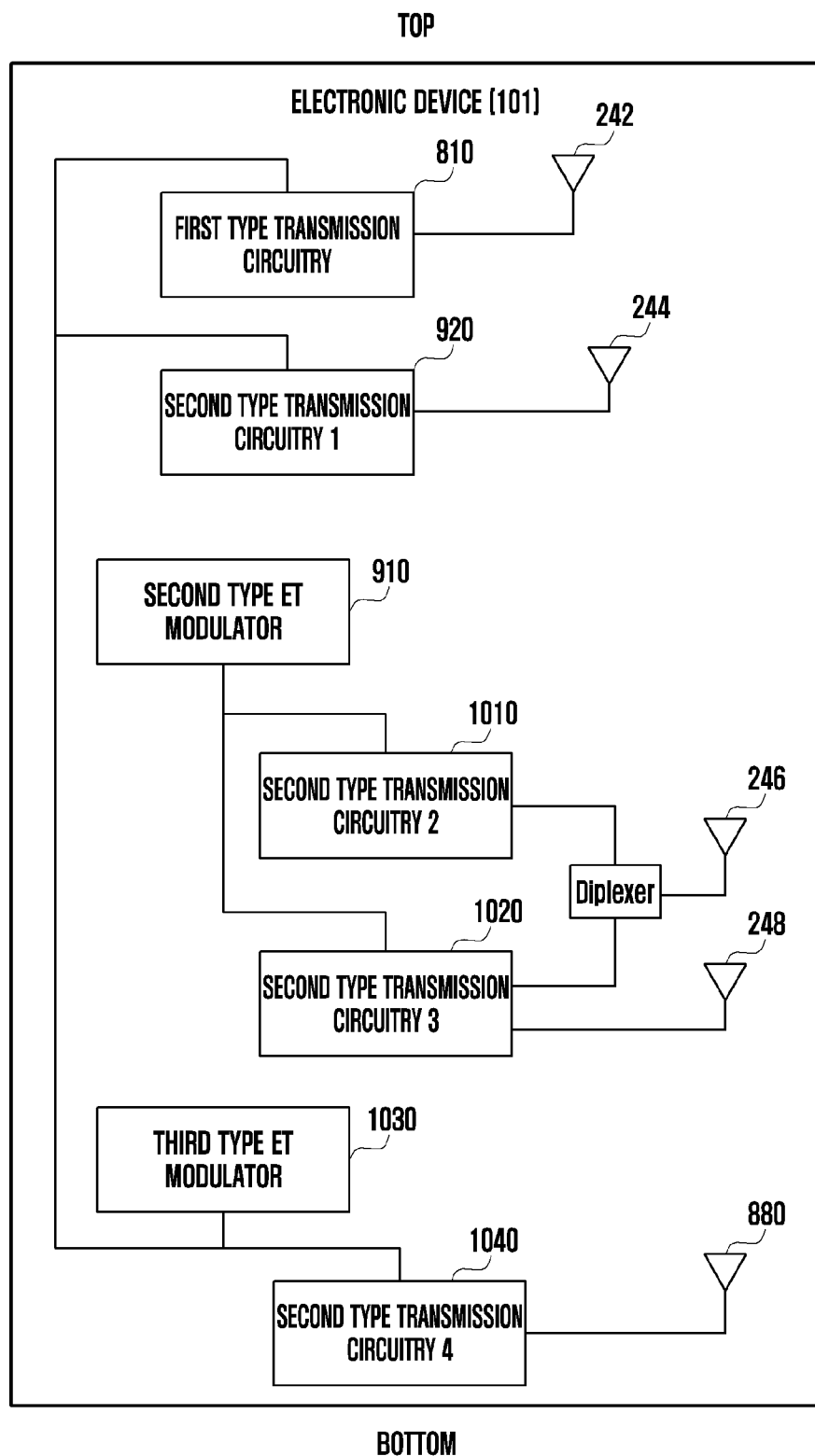
FIG. 10 is a diagram illustrating an example configuration of an electronic device including a transmission circuitry having an ET modulator applied thereto according to various embodiments.

FIG. 8 is a diagram illustrating an example configuration of an electronic device including a transmission circuitry having an ET modulator applied thereto according to various embodiments, FIG. 9 is a diagram illustrating an example configuration of an electronic device including a transmission circuitry having an ET modulator applied thereto according to various embodiments, and FIG. 10 is a diagram illustrating an example configuration of an electronic device including a transmission circuitry having an ET modulator applied thereto according to various embodiments.

According to an embodiment, an antenna capable of transmission may exist inside the electronic device (for example, the electronic device 101 in FIG. 1). For example, an electronic device for 4G may normally transmit RF signals to a base station using the antenna on the bottom of the electronic device. However, in order to increase the uplink throughput (T-put), uplink carrier aggregation (ULCA) technology is applied to electronic devices for 4G, and evolved-universal terrestrial radio access-new radio (UTRA-NR) dual connectivity technology is applied to electronic devices for 5G. In order to simultaneously transmit two or more independent RF signals in this manner, not only the antenna on the bottom of the electronic device, but also the antenna on the top of the electronic device need to be used. According to an embodiment, various RF signals may be transmitted using only the antenna on the bottom, but parasitic components such as intermodulation distortion (IMD)/harmonic waves may make it difficult to satisfy the 3GPP Spurious spec and may cause sensitivity degradation. Therefore, an ET modulator and a transmission circuitry may be arranged and configured on the top and bottom of an electronic device in various types for the purpose of top/bottom transmission (Tx) as illustrated in FIG. 8, FIG. 9 and FIG. 10.

According to various embodiments, the electronic device may be configured such that the ET modulator (for example, the first type ET modulator 450 in FIG. 4B or FIG. 6B) includes only a switching regulator (for example, the switching regulator 430 in FIG. 4B or FIG. 6B), and the transmission circuitry (for example, the transmission circuitry 310 in FIG. 6B) (hereinafter, referred to as a "first type transmission circuitry") includes a linear regulator (for example, the linear regulator 313 in FIG. 6B) and a comparator (for example, the comparator 420 in FIG. 6B). This can compensate for not only noise generated by the switching regulator, but also distortion resulting from trace inductance inside the electronic device. This makes it possible to implement various embodiments using a minimum and/or reduced ET modulator without a limitation on the distance between the ET modulator and the transmission circuitry, even in a scenario in which ULCA/ENDC needs to be supported, without having to use multiple complicated ET modulators (for example, the second type ET modulator 400 in FIG. 4A) on the top and bottom of the electronic device. In addition, using a simple ET modulator (for example, the first type ET modulator 430) may have advantages in connection with the size, the mounting area, the unit price, or circuitry arrangement (for degree of freedom of design).

In the following description with reference to FIG. 8 and FIG. 9, an ET modulator including only a switching regulator (for example, the switching regulator 430 in FIG. 4B or FIG. 6B) as in the case of the ET modulator according to various embodiments (for example, the ET modulator 450 in FIG. 4B or FIG. 6B) will be referred to as a "first type ET modulator", and an ET modulator including a switching regulator (for example, the switching regulator 430 in FIG. 4A or FIG. 6A), a linear regulator (for example, the linear regulator 410 in FIG. 4A or FIG. 6A), and a comparator (for example, the comparator 420 in FIG. 4A or FIG. 6A) as in the case of an ET modulator having an existing structure (for example, the ET modulator 400 in FIG. 4A or FIG. 6A) will be referred to as a "second type ET modulator". Likewise, in the following description, a transmission circuitry including a linear regulator (for example, the linear regulator 313 in FIG. 6B) and a comparator (for example, the comparator 420 in FIG. 6B) as in the case of the transmission circuitry according to various embodiments (for example, the transmission circuitry 310 in FIG. 6B) will be referred to as a "first type transmission circuitry", and a transmission circuitry having an existing structure (for example, the transmission circuitry 600 in FIG. 6A) will be referred to as a "second type transmission circuitry".

FIG. 8 is a diagram illustrating the configuration of an electronic device according to an example embodiment. Referring to FIG. 8, the electronic device according to the first embodiment (for example, the electronic device 101 in FIG. 1) may include a first type transmission circuitry 1 810, a first type transmission circuitry 2 820, a first type ET modulator 1 830, a first type transmission circuitry 3 840, a first type transmission circuitry 4 850, a first type ET modulator 2 860, a first type transmission circuitry 5 870, a first antenna module (for example, the first antenna module 242 in FIG. 2), a second antenna module (for example, the second antenna module 244 in FIG. 2), a third antenna module (for example, the third antenna module 246 in FIG. 2), a fourth antenna module (for example, the fourth antenna module 248 in FIG. 2), and a fifth antenna module 880.

The first type transmission circuitry 1 810 to the first type transmission circuitry 5 870 may be the first transmission circuitry 310 or the second transmission circuitry 320 illustrated in FIG. 3 or FIG. 6B. The first type transmission circuitry 1 810 to the first type transmission circuitry 5 870 (e.g., 810, 820, 840, 850 and 870) may include a linear regulator (for example, the first linear regulator 313 or the second linear regulator 323) or a comparator. Each of the first type transmission circuitry 1 810 to the first type transmission circuitry 5 870 may amplify a transmission signal in a different frequency band or in the same frequency band. For example, the first type transmission circuitry 1 810 to the first type transmission circuitry 5 870 may be configured to process signals in different frequency bands.

The first type ET modulator 1 830 or the first type ET modulator 2 860 may include a switching regulator (for example, the switching regulator 340 in FIG. 3 or the switching regulator 430 in FIG. 4B). The first type ET modulator 1 830 or the first type ET modulator 2 860 may refer to the ET modulator 450 in FIG. 4B.

The first antenna module 242 to the fifth antenna module 880 (e.g., 242, 244, 246, 248, 880) may transmit a first transmission signal to a fifth transmission signal, which have been amplified by the first type transmission circuitry 1 810 to the first type transmission circuitry 5 870, to the base station through the network.

According to various embodiments, the first type transmission circuitry 1 810 and the first type transmission circuitry 2 820 may be arranged on the top of the electronic device 101, and the first type ET modulator 2 860 and the first type transmission circuitry 5 870 may be arranged on the bottom of the electronic device 101. Since the first type transmission circuitry 1 810 to the first type transmission circuitry 5 870 include linear regulators in the disclosure, the first type ET modulator 2 860 may be electrically connected to the first type transmission circuitry 1 810 and the first type transmission circuitry 2 820 even if the first type ET modulator 2 860 is arranged on the bottom of the electronic device 101. The first type ET modulator 2 860 may have little or no difficulty in providing an envelope signal even if the distance from the first type transmission circuitry 1 810 and the first type transmission circuitry 2 820 increases. For example, since the final envelope signal is output form the linear regulators included in the first type transmission circuitry 1 810 and the first type transmission circuitry 2 820, little or no signal distortion may occur.

According to the prior art, one ET modulator may be necessary for every at least two transmission circuitries because the envelope output signal from the ET modulator is distorted if the frequency band becomes wider, or if the distance between the ET modulator (for example, second type ET modulator) and the transmission circuitries increases. The electronic device 101 according to the first embodiment can configure a circuitry using a small number of ET modulators because the first type transmission circuitry 1 810 to the first type transmission circuitry 5 870 include linear regulators such that the envelope output signal from the ET modulator is not distorted even if the frequency band becomes wider, or even if the distance between the ET modulator (for example, first type ET modulator) and the transmission circuitries (for example, first type transmission circuitry) increases.

FIG. 9 is a diagram illustrating an example configuration of an electronic device according to another example embodiment.

Referring to FIG. 9, the electronic device according to the example embodiment (for example, the electronic device 101 in FIG. 1) may include a first type transmission circuitry 1 810, a first type transmission circuitry 2 820, a second type ET modulator 910, a second type transmission circuitry 1 920, a second type transmission circuitry 9 930, a first type ET modulator 830, a first type transmission circuitry 3 940, a first antenna module (for example, the first antenna module 242 in FIG. 2), a second antenna module (for example, the second antenna module 244 in FIG. 2), a third antenna module (for example, the third antenna module 246 in FIG. 2), a fourth antenna module (for example, the fourth antenna module 248 in FIG. 2), and a fifth antenna module 880.

The first type transmission circuitry 1 810, the first type transmission circuitry 2 820, or the first type transmission circuitry 3 940 may be the first transmission circuitry 310 or the second transmission circuitry 320 illustrated in FIG. 3 or FIG. 6B. The first type transmission circuitry 1 810, the first type transmission circuitry 2 820, and/or the first type transmission circuitry 3 940 may include a linear regulator (for example, the first linear regulator 313 or the second linear regulator 323) or a comparator. Each of the first type transmission circuitry 1 810, the first type transmission circuitry 2 820, and/or the first type transmission circuitry 3 940 may amplify a transmission signal in a different frequency band or in the same frequency band. For example, the first type transmission circuitry 1 810 to the first type transmission circuitry 3 940 may be configured to process signals in different frequency bands.

The second type transmission circuitry 1 920 and/or the second type transmission circuitry 2 930 may be the transmission circuitry 600 illustrated in FIG. 6A. For example, the second type transmission circuitry 1 920 or the second type transmission circuitry 2 930 may not include a linear regulator or a comparator and may include, for example, a power amplifier (PA) 610, a low-noise amplifier (LNA) 620, a filter/duplexer 630, multiple MIPI controllers 640, and an antenna switch (ASW) 650.

The second type ET modulator 910 may include a linear regulator (for example, the linear regulator 410 in FIG. 4A), a comparator (for example, the comparator 420 in FIG. 4A), and a switching regulator (for example, the switching regulator 430 in FIG. 4A). The second type ET modulator 910 may be the ET modulator 400 illustrated in FIG. 4A.

The first type ET modulator 830 may include a switching regulator (for example, the switching regulator 340 in FIG. 3 or the switching regulator 430 in FIG. 4B). The first type ET modulator 830 may refer to the ET modulator 450 in FIG. 4B.

The first antenna module 242 to the fifth antenna module 880 may transmit a first transmission signal to a fifth transmission signal, which have been amplified by the first type transmission circuitry 1 810 to the first type transmission circuitry 3 940, the second type transmission circuitry 1 920, and the second type transmission circuitry 2 930, to the base station through the network.

According to various embodiments, the first type transmission circuitry 1 810 and the first type transmission circuitry 2 820 may be arranged on the top of the electronic device 101, and the first type ET modulator 830 may be arranged on the bottom of the electronic device 101. Since the first type transmission circuitry 1 810 and the first type transmission circuitry 2 820 include linear regulators in the disclosure, the first type ET modulator 830 may be electrically connected to the first type transmission circuitry 1 810 and the first type transmission circuitry 2 820 even if the first type ET modulator 830 is arranged on the bottom of the electronic device 101. The first type ET modulator 830 may have little or no difficulty in providing an envelope signal even if the distance from the first type transmission circuitry 1 810 and the first type transmission circuitry 2 820 increases. For example, since the final envelope signal is output from the linear regulators included in the first type transmission circuitry 1 810 and the first type transmission circuitry 2 820, little or no signal distortion may occur.

According to various embodiments, the second type ET modulator 910 may be connected to the second type transmission circuitry 1 920 and the second type transmission circuitry 2 930. Since the envelope signal output from the second type ET modulator 910 is directly transmitted to the second type transmission circuitry 1 920 and the second type transmission circuitry 2 930, little or no signal distortion may occur. The electronic device 101 according to the second embodiment can configure a circuitry using a small number of ET modulators because the envelope output signal from the first type ET modulator 830 is not distorted even if the frequency band becomes wider, or even if the distance between the first type ET modulator 830 and the first type transmission circuitry 1 810 and the first type transmission circuitry 2 820 increases.

Various embodiments may be implemented using a reduced or minimum ET modulator without a limitation on the distance between the ET modulator and the transmission circuitry, even in a scenario in which ULCA/ENDC needs to be supported. In addition, using a simple ET modulator (for example, first type ET modulator) may have advantages in connection with the size, the mounting area, the unit price, or circuitry arrangement (for degree of freedom of design).

FIG. 10 is a diagram illustrating an example configuration of an electronic device according to another example embodiment.

Referring to FIG. 10, the electronic device according to another example embodiment (for example, the electronic device 101 in FIG. 1) may include a first type transmission circuitry 810, a second type transmission circuitry 1 920, a second type ET modulator 910, a second type transmission circuitry 2 1010, a second type transmission circuitry 3 1020, a third type ET modulator 1030, a second type transmission circuitry 4 1040, a first antenna module (for example, the first antenna module 242 in FIG. 2), a second antenna module (for example, the second antenna module 244 in FIG. 2), a third antenna module (for example, the third antenna module 246 in FIG. 2), a fourth antenna module (for example, the fourth antenna module 248 in FIG. 2), and a fifth antenna module 880.

The first type transmission circuitry 810 may be the first transmission circuitry 310 or the second transmission circuitry 320 illustrated in FIG. 3 or FIG. 6B. The first type transmission circuitry 810 may include a linear regulator (for example, the first linear regulator 313 or the second linear regulator 323) or a comparator.

The second type transmission circuitry 1 920, the second type transmission circuitry 2 1010, the second type transmission circuitry 3 1020, or the second type transmission circuitry 4 1040 may be the transmission circuitry 600 illustrated in FIG. 6A. For example, the second type transmission circuitry 1 920, the second type transmission circuitry 2 1010, the second type transmission circuitry 3 1020, or the second type transmission circuitry 4 1040 may not include a linear regulator or a comparator and may include, for example, a power amplifier (PA) 610, a low-noise amplifier (LNA) 620, a filter/duplexer 630, multiple MIPI controllers 640, and an antenna switch (ASW) 650.

The second type ET modulator 910 may include a linear regulator (for example, the linear regulator 410 in FIG. 4A), a comparator (for example, the comparator 420 in FIG. 4A), and a switching regulator (for example, the switching regulator 430 in FIG. 4A). The second type ET modulator 910 may be the ET modulator 400 illustrated in FIG. 4A.

The third type ET modulator 1030 may include a linear regulator (for example, the linear regulator 410 in FIG. 4C), a comparator (for example, the comparator 420 in FIG. 4C), a switching regulator (for example, the switching regulator 430 in FIG. 4C), and a multiplexer (for example, the multiplexer 480 in FIG. 4C). The third type ET modulator 1030 may be the ET modulator 470 illustrated in FIG. 4C.

The first antenna module 242 to the fifth antenna module 880 (e.g., 242, 244, 246, 248, 880) may transmit a first transmission signal to a fifth transmission signal, which have been amplified by the first type transmission circuitry 810 and the second type transmission circuitry 1 920 to the second type transmission circuitry 4 1040, to the base station through the network.

According to various embodiments, the first type transmission circuitry 810 and the second type transmission circuitry 1 920 may be arranged on the top of the electronic device 101, and the third type ET modulator 1030 may be arranged on the bottom of the electronic device 101. The third type ET modulator 1030 may control signals input to switching regulators when an envelope signal is provided to the first type transmission circuitry 810 using the multiplexer 480, and when an envelope signal is provided to the second type transmission circuitry 1 920 and the second type transmission circuitry 4 1040.

For example, when amplifying the first transmission signal of the first type transmission circuitry 810 including a linear regulator, the typed type ET modulator 1030 may output the signal output from the linear regulator included in the first type transmission circuitry 810 to the switching regulator 430 as an input signal. When amplifying the transmission signals of the second type transmission circuitry 1 920 and the second type transmission circuitry 4 1040 that include no linear regulators, the third type ET modulator 1030 may output the signal output from the linear regulator 410 included in the third type ET modulator 1030 to the switching regulator 430 as an input signal.

In the disclosure, the first type transmission circuitry 810 includes a linear regulator, and the third type ET modulator 1030 includes a linear regulator, a comparator, a switching regulator, and a multiplexer such that, even if the third type ET modulator 1030 is arranged on the bottom of the electronic device 101, the third type ET modulator 1030 may be electrically connected to the first type transmission circuitry 810 and the second type transmission circuitry 1 920. For example, since the final envelope signal is output from the linear regulator included in the first type transmission circuitry 810 or from the linear regulator included in the third type ET modulator 1030, little or no signal distortion may occur.

According to various embodiments, the second type ET modulator 910 may be connected to the second type transmission circuitry 2 1010 and the second type transmission circuitry 3 1020. Since the envelope signal output from the second type ET modulator 910 is directly transmitted to the second type transmission circuitry 2 1010 and the second type transmission circuitry 3 1020, little or no signal distortion may occur. The electronic device 101 according to this example embodiment may have a circuitry configured using a small number of ET modulators because the final envelope output signal is not distorted even if the frequency band becomes wider, or even if the distance between the third type ET modulator 1030 and the first type transmission circuitry 810 or the second type transmission circuitry 1 920 increases.

As described above, an electronic device according to various embodiments may include: a first transmission circuitry including a first amplifier configured to amplify a first transmission signal and a first linear regulator configured to supply a first voltage to the first amplifier based on an envelope corresponding to a first designated frequency band of the first transmission signal; a second transmission circuitry including a second amplifier configured to amplify a second transmission signal and a second linear regulator configured to supply a second voltage to the second amplifier based on an envelope corresponding to a second designated frequency band of the second transmission signal; a switching regulator electrically connected to the first amplifier and the second amplifier; and a control circuitry. The control circuitry may be configured to, based on the first transmission signal being transmitted to an external electronic device through the first transmission circuitry, supply a third voltage to the first amplifier using the switching regulator based on an envelope corresponding to a third frequency band, the third frequency band being lower than the first designated frequency band of the first transmission signal. In addition, the control circuitry 330 may be configured, based on the second transmission signal being transmitted to the external electronic device through the second transmission circuitry, supply a fourth voltage to the second amplifier using the switching regulator, based on an envelope corresponding to the third frequency band, the third frequency band being lower than the second designated frequency band of the second transmission signal.

According to various example embodiments, the first transmission circuitry may further include a first comparator configured to compare the first voltage and the third voltage, and the second transmission circuitry may further include a second comparator configured to compare the second voltage and the fourth voltage.

According to various example embodiments, the first linear regulator may be configured to control the first voltage to track the envelope corresponding to the first designated frequency band, and the second linear regulator may be configured to control the second voltage to track the envelope corresponding to the second designated frequency band.

According to various example embodiments, the first linear regulator and/or the second linear regulator may be configured to regulate and thus compensate for noise generated by the switching regulator.

According to various example embodiments, the first designated frequency band may differ from the second designated frequency band.

According to various example embodiments, the first transmission circuitry may further include a multiplexer, and the control circuitry may be configured to control the multiplexer to control the voltage input to the switching regulator.

As described above, an electronic device according to various example embodiments may include: a first transmission circuitry including a first amplifier configured to amplify a first transmission signal and a first linear regulator configured to provide a first envelope signal to the first amplifier based on an envelope corresponding to a first designated frequency band of the first transmission signal; a second transmission circuitry including a second amplifier configured to amplify a second transmission signal; an envelope tracking (ET) modulator comprising ET modulating circuit electrically connected to the first amplifier and the second amplifier; and a control circuitry. The control circuitry may be configured based on the first transmission signal being transmitted to an external electronic device through the first transmission circuitry, to provide the first envelope signal to the first amplifier using the ET modulator. In addition, the control circuitry may be configured based on the second transmission signal being transmitted to the external electronic device through the second transmission circuitry, to provide a second envelope signal output from the ET modulator to the second amplifier.

According to various example embodiments, the ET modulator may include a switching regulator, and the control circuitry may be configured to provide the first envelope signal generated by a high-frequency signal output from the first linear regulator and a low-frequency signal output from the switching regulator to the first amplifier.

According to various example embodiments, the ET modulator may include a switching regulator and a second linear regulator, and the control circuitry 330 may be configured to provide the second envelope signal generated by a high-frequency signal output from the second linear regulator and a low-frequency signal output from the switching regulator to the second amplifier 321.

According to various example embodiments, the ET modulator may include a switching regulator, the second transmission circuitry may further include a second linear regulator, and the control circuitry may be configured to provide the second envelope signal generated by a high-frequency signal output from the second linear regulator and a low-frequency signal output from the switching regulator to the second amplifier.

According to various example embodiments, the ET modulator may further include a second linear regulator, a switching regulator, and a multiplexer, and the control circuitry may be configured to control the multiplexer to control the signal input to the switching regulator.

According to various example embodiments, based on amplifying the first transmission signal of the first transmission circuitry, the control circuitry 330 may be configured to control the multiplexer to output the signal output from the first linear regulator as an input signal to the switching regulator.

According to various example embodiments, the ET modulator may further include a second linear regulator, and, based on amplifying the second transmission signal of the second transmission circuitry, the control circuitry may be configured to control the multiplexer to output the signal output from the second linear regulator included in the ET modulator as an input signal to the switching regulator.

As described above, an electronic device according to various example embodiments may include: a first transmission circuitry including a first amplifier configured to amplify a first transmission signal and a first linear regulator configured to provide a first voltage to the first amplifier, based on an envelope corresponding to a first designated frequency band of the first transmission signal; a second transmission circuitry including a second amplifier configured to amplify a second transmission signal; an envelope tracking (ET) modulator comprising ET modulating circuit electrically connected to the first amplifier and the second amplifier, the ET modulator including a second linear regulator configured to supply a second voltage to the second amplifier, based on an envelope corresponding to the second designated frequency band of the second transmission signal; and a control circuitry. The control circuitry 330 may be configured based on the first transmission signal being transmitted to an external electronic device through the first transmission circuitry, to supply a third voltage to the first amplifier using the ET modulator, based on an envelope corresponding to a third frequency band, the third frequency band being lower than the first designated frequency band of the first transmission signal. In addition, the control circuitry 330 may be configured based on the second transmission signal being transmitted to the external electronic device through the second transmission circuitry, to supply a fourth voltage to the second amplifier using the switching regulator, based on an envelope corresponding to the third frequency band, the third frequency band being lower than the second designated frequency band of the second transmission signal.

According to various example embodiments, the ET modulator may further include a switching regulator, and the control circuitry may be configured to supply the third voltage to the first amplifier using the switching regulator, and the fourth voltage is supplied to the second amplifier using the switching regulator.

According to various example embodiments, the first transmission circuitry may further include a first comparator configured to compare the first voltage and the third voltage, and the ET modulator may further include a second comparator configured to compare the second voltage and the fourth voltage.

According to various example embodiments, the ET modulator may further include a switching regulator and a multiplexer, and the control circuitry 330 may be configured to control the multiplexer to control the voltage input to the switching regulator.

According to various example embodiments, based on amplifying the first transmission signal of the first transmission circuitry, the control circuitry may be configured to control the multiplexer to output the signal output from the first linear regulator as an input signal to the switching regulator. In addition, based on amplifying the second transmission signal of the second transmission circuitry, the control circuitry may be configured to control the multiplexer to output the signal output from the second linear regulator included in the ET modulator as an input signal to the switching regulator.

According to various example embodiments, the ET modulator 450 may further include a switching regulator, and the first linear regulator or the second linear regulator may be configured to regulate and thus compensate for noise generated by the switching regulator.

According to various example embodiments, the first designated frequency band may differ from the second designated frequency band.

Figure 11:
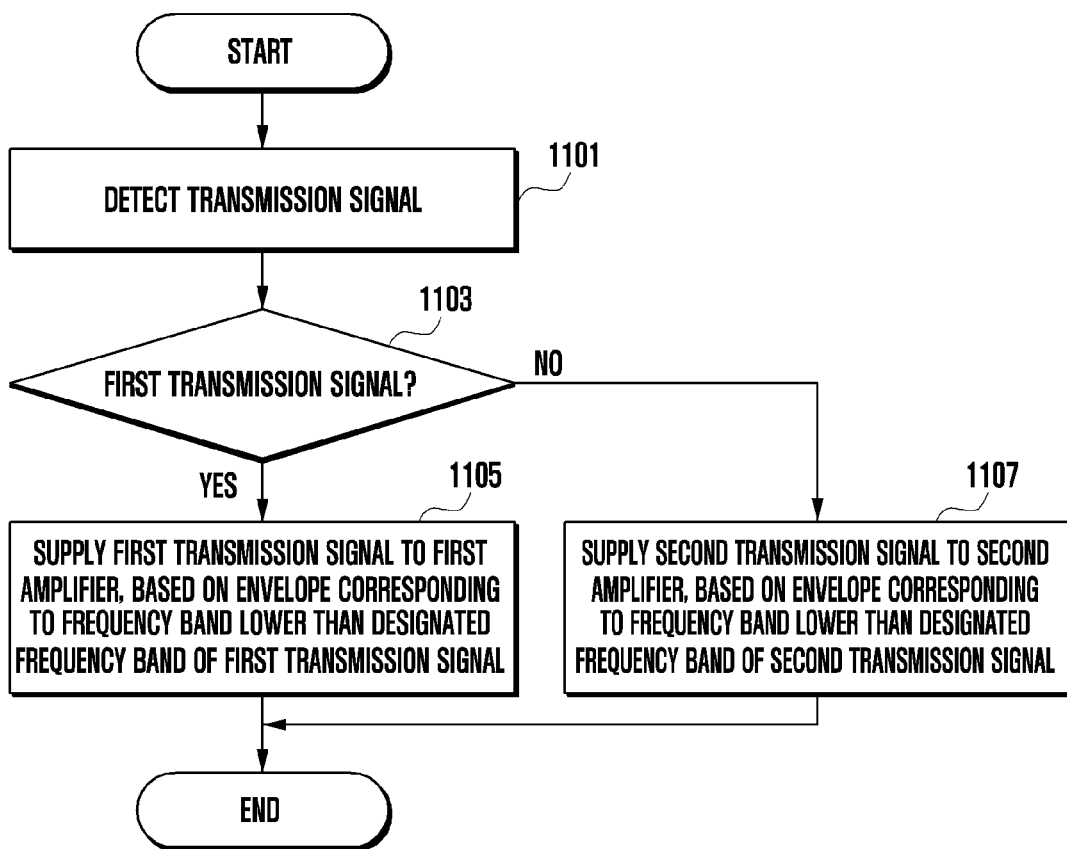
FIG. 11 is a flowchart illustrating an example method for operating an electronic device according to various embodiments.

FIG. 11 is a flowchart illustrating an example method for operating an electronic device according to various embodiments.

Referring to FIG. 11, in operation 1101, the control circuitry 330 of the electronic device 101 may detect a transmission signal. According to an embodiment, the control circuitry 330 may refer to a comprehensive concept including a circuitry for controlling wireless communication according to various example embodiments, such as a communication processor (for example, the processor 120, the first communication processor 212, or the second communication processor 214 in FIG. 2), an RFIC (for example, the first RFIC 222 or the second RFIC 224 in FIG. 2), a wireless communication module (for example, the wireless communication module 192 in FIG. 1 or FIG. 2), or an ET DAC.

According to an embodiment, the electronic device may include: a first transmission circuitry including a first amplifier configured to amplify a first transmission signal and a first linear regulator configured to supply a first voltage to the first amplifier, based on an envelope corresponding to a first designated frequency band of the first transmission signal; and a second transmission circuitry including a second amplifier configured to amplify a second transmission signal and a second linear regulator configured to supply a second voltage to the second amplifier, based on an envelope corresponding to a second designated frequency of the second transmission signal. According to an embodiment, the first designated frequency band may differ from the second designated frequency band. According to an embodiment, the electronic device may include an ET modulator comprising ET modulating circuit electrically connected to the first amplifier and the second amplifier. According to various embodiments, the ET modulator may include a switching regulator. According to an embodiment, the first transmission circuitry may further include a first comparator configured to compare the first voltage and the third voltage, and the second transmission circuitry may further include a second comparator configured to compare the second voltage and the fourth voltage. According to an embodiment, the first linear regulator may be configured to control the first voltage to track the envelope corresponding to the first designated frequency band, and may be configured to regulate and thus compensate for noise generated by the switching regulator. According to an embodiment, the second linear regulator may be configured to control the second voltage to track the envelope corresponding to the second designated frequency band, and may be configured to regulate and thus compensate for noise generated by the switching regulator.

In operation 1103, the control circuitry 330 may determine whether the transmission signal corresponds to a first transmission signal or to a second transmissions signal.

If the transmission signal is a first transmission signal in operation 1103 (for example, "YES" in operation 1103), the control circuitry 330 may conduct control, in operation 1105, such that the first transmission signal is supplied to the first amplifier 311, based on an envelope corresponding to a frequency band that is lower than the designated frequency band of the first transmission signal. According to an embodiment, when the first transmission signal is transmitted to an external electronic device through the first transmission circuitry 310, the control circuitry 330 may conduct control such that a third voltage is supplied to the first amplifier 311 using the switching regulator 340 or 430, based on an envelope corresponding to a third frequency band that is lower than the first designated frequency band of the first transmission signal.

If the transmission signal is a second transmission signal in operation 1103 (for example, "NO" in operation 1103), the control circuitry 330 may conduct control, in operation 1107, such that the second transmission signal is supplied to the second amplifier 321, based on an envelope corresponding to a frequency band that is lower than the designated frequency band of the second transmission signal. According to an embodiment, when the second transmission signal is transmitted to an external electronic device through the second transmission circuitry 320, the control circuitry 330 may conduct control such that a fourth voltage is supplied to the second amplifier 321 using the switching regulator 340 or 430, based on an envelope corresponding to a third frequency band that is lower than the second designated frequency band of the second transmission signal.

According to various example embodiments, a linear regulator of an ET modulator is included in a transmission circuitry such that ET technology can be applied to signals having wide bandwidths without any and/or reduced limitation on the distance between the ET modulator and the transmission circuitry.

According to various example embodiments, the electronic device has a power amplifier configured using a small number of ET modulators such that an uplink carrier aggregation (ULCA) or e-ULTRA-NR dual connectivity (ENDC) technology can be implemented in connection with the electronic device.

The various example embodiments of the disclosure disclosed herein and illustrated in the drawings are merely examples presented to easily describe technical details of the disclosure and to aid in the understanding of the disclosure, and are not intended to limit the scope of the disclosure. Therefore, it should be understood that, in addition to the embodiments disclosed herein, all modifications and changes or modified and changed forms derived from the technical idea of the disclosure fall within the scope of the disclosure.

What is claimed is:

1. An electronic device comprising:
   an antenna;
   a switching regulator;
   communication chip including an amplifier and a linear regulator operably connected to the amplifier and the switching regulator, the communication chip configured to transmit a radio-frequency signal through the antenna, the amplifier being configured to receive an input signal, wherein the radio-frequency signal corresponds to the input signal of the amplifier; and
   control circuitry configured to control the communication chip such that the linear regulator provides the amplifier with a voltage corresponding to an envelope of the input signal,
   wherein the linear regulator and the amplifier are disposed inside the communication chip, and the switching regulator is disposed outside the communication chip.

2. The electronic device of claim 1, wherein the control circuitry includes an envelope tracking digital-analog converter (ET DAC), and the ET DAC is disposed inside the communication chip.

3. The electronic device of claim 1, wherein the switching regulator is a first switching regulator, the communication chip is first communication chip, the amplifier is a first amplifier, and the linear regulator is a first linear regulator, wherein the electronic device further comprises:
   an envelope tracking (ET) modulator including a second switching regulator and a second linear regulator; and
   second communication chip operably connected to the ET modulator and including a second amplifier.

4. The electronic device of claim 1, wherein the communication chip is first communication chip, the amplifier is a first amplifier, and the linear regulator is a first linear regulator, wherein the electronic device further comprises second communication chip including a second amplifier and a second linear regulator, and the switching regulator is operably connected to the second communication chip.

5. The electronic device of claim 4, wherein the first communication chip is arranged closer to a lower end of the electronic device than an upper end of the electronic device, the second communication chip is arranged closer to the upper end of the electronic device than the lower end of the electronic device, and the switching regulator is arranged such that an electric path between the switching regulator and the second communication chip is longer than an electric path between the switching regulator and the first communication chip.

6. The electronic device of claim 1, wherein the amplifier is a first amplifier, wherein the communication chip further comprises a second amplifier.

7. The electronic device of claim 6, wherein the second amplifier is configured to amplify a radio-frequency signal received through the antenna.

8. The electronic device of claim 6, wherein the first amplifier is a power amplifier, and the second amplifier is a low-noise amplifier.

9. The electronic device of claim 1, wherein the control circuitry includes an envelope tracking digital-analog converter (ET DAC) configured to adjust the envelope to track the radio-frequency signal to be transmitted through the antenna.

10. The electronic device of claim 1, wherein the switching regulator and the communication chip are arranged such that an electric path between the switching regulator and the linear regulator included in the communication chip is longer than an electric path between the linear regulator and the amplifier.

11. The electronic device of claim 1, wherein the control circuitry is included in the communication chip, and the switching regulator and the communication chip are arranged such that an electric path between the switching regulator and the linear regulator included in the communication chip is longer than an electric path between the control circuitry and the linear regulator.

12. A communication chip for mounting on a circuit board of an electronic device to amplify a radio-frequency signal to be transmitted or received through an antenna of the electronic device, the communication chip comprising:
- an amplifier configured to receive an input signal, wherein a radio-frequency signal to be transmitted through the antenna corresponds to the input signal of the amplifier; and
- a linear regulator configured to control a switching regulator of the electronic device to provide the amplifier with a voltage corresponding to an envelope of the input signal,
- wherein the linear regulator and the amplifier are disposed inside the communication chip, and the switching regulator is disposed outside the communication chip.

13. The communication chip of claim 12, wherein when the communication chip is mounted on the circuit board of the electronic device, a first electric path between the amplifier and the linear regulator is shorter than a second electric path between the switching regulator and the linear regulator.

14. The communication chip of claim 13, wherein the second electric path is longer than a third electric path between an envelope tracking digital-analog converter (ET DAC) and the linear regulator.

15. The communication chip of claim 12, further comprising a low-noise amplifier, wherein
- the low-noise amplifier is configured to amplify a radio-frequency signal received through the antenna, and
- the amplifier is configured to amplify a radio-frequency signal to be transmitted through the antenna.

16. The communication chip of claim 12, further comprising an envelope tracking digital-analog converter (ET DAC) operably connected to the linear regulator, the ET DAC configured to control the linear regulator to provide the amplifier with a voltage corresponding to an envelope of an input signal input to the amplifier, the input signal corresponding to the radio-frequency signal to be transmitted through the antenna.

17. The communication chip of claim 12, wherein the linear regulator is configured to adjust a voltage corresponding to the envelope of the input signal to track the envelope.

18. The communication chip of claim 12, wherein the linear regulator is configured to regulate a signal output from the switching regulator such that a voltage corresponding to the envelope is output.

19. An electronic device comprising:
- an antenna;
- a switching regulator;
- an amplifier operably connected to the switching regulator, and configured to receive an input signal, wherein a radio-frequency signal to be transmitted through the antenna corresponds to the input signal of the amplifier;
- a linear regulator operably connected to the switching regulator and the amplifier; and
- an envelope tracking digital-analog converter (ET DAC) configured to control the linear regulator to provide the amplifier with a voltage corresponding to an envelope of the input signal,
- wherein an entire electric path coupled between the linear regulator and the amplifier is disposed within a communication chip, and
- wherein a portion of electric path coupled between the switching regulator and the linear regulator is disposed between the communication chip and a separate electronic component containing the switching regulator.

* * * * *